United States Patent
Wang et al.

(10) Patent No.: US 11,533,036 B2
(45) Date of Patent: Dec. 20, 2022

(54) TRANSFORMER-BASED WIDEBAND FILTER WITH RIPPLE REDUCTION

(71) Applicant: Apple Inc., Cupertino, CA (US)

(72) Inventors: Hongrui Wang, San Jose, CA (US); Sohrab Emami-Neyestanak, San Francisco, CA (US); Saihua Lin, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/234,027

(22) Filed: Apr. 19, 2021

(65) Prior Publication Data

US 2021/0391843 A1     Dec. 16, 2021

Related U.S. Application Data

(63) Continuation of application No. 16/898,054, filed on Jun. 10, 2020, now Pat. No. 10,985,724.

(51) Int. Cl.
| | |
|---|---|
| *H03H 7/09* | (2006.01) |
| *H03H 7/01* | (2006.01) |
| *H01F 27/28* | (2006.01) |
| *H03H 7/06* | (2006.01) |
| *H03H 1/00* | (2006.01) |

(52) U.S. Cl.
CPC .............. *H03H 7/09* (2013.01); *H01F 27/28* (2013.01); *H03H 7/06* (2013.01); *H03H 2001/0085* (2013.01)

(58) Field of Classification Search
CPC .......................... H03H 2001/0085; H03H 7/09

USPC .................................................. 333/177, 181
See application file for complete search history.

(56) References Cited

U.S. PATENT DOCUMENTS

| | | | |
|---|---|---|---|
| 7,180,389 B2 | 2/2007 | Wang et al. | |
| 7,671,706 B2 | 3/2010 | Taniguchi | |
| 9,093,978 B2 | 7/2015 | Jooyaie et al. | |
| 2013/0141187 A1* | 6/2013 | Chuang | H03H 7/0161 333/175 |
| 2013/0154768 A1 | 6/2013 | Taniguchi | |
| 2014/0320230 A1 | 10/2014 | Jooyaie et al. | |
| 2014/0320374 A1 | 10/2014 | Lai et al. | |
| 2015/0071139 A1* | 3/2015 | Nix | H04W 52/0216 370/311 |
| 2016/0036390 A1* | 2/2016 | Lin | H03F 3/19 330/295 |
| 2016/0191010 A1* | 6/2016 | Freeman | H03H 7/06 333/176 |

OTHER PUBLICATIONS

Office Action for Indian Patent Application No. 202114025332 dated Apr. 1, 2022; 6 pgs.

* cited by examiner

*Primary Examiner* — Rakesh B Patel
(74) *Attorney, Agent, or Firm* — Fletcher Yoder, P.C.

(57) ABSTRACT

A radio frequency filtering circuitry includes a first inductor, a second inductor, and a conductive loop. The first inductor receives a first current that induces a second current in the second inductor upon receiving the first current. The first inductor and/or the second inductor induce a third current in the conductive loop. The conductive loop adjusts the third current to reduce a first gain peak of an output signal to correlate to a second gain peak of the output signal.

20 Claims, 10 Drawing Sheets

TRANSFORMER-BASED WIDEBAND FILTER WITH RIPPLE REDUCTION

CROSS-REFERENCE TO RELATED APPLICATIONS

This application is a continuation of U.S. patent application Ser. No. 16/898,054, filed Jun. 10, 2020 and entitled "TRANSFORMER-BASED WIDEBAND FILTER WITH RIPPLE REDUCTION," which is incorporated herein by reference in its entirety for all purposes.

BACKGROUND

The present disclosure relates generally to electronic devices, and more particularly, to electronic devices that transmit and receive radio frequency signals for wireless communication.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

An electronic communication device may include radio frequency filtering circuitry that enables pass-through or blocks certain frequencies in an outgoing signal so that the signal may be transmitted over a desired frequency. By way of example, many electronic devices utilize radio frequency filtering circuitry that includes wide-band filters to allow signals within a wide bandwidth (e.g., large range of frequencies) to pass through. The radio frequency filtering circuitry may include one or more coupled resonators to form one or more filters. A resonator may refer to a device, system, or circuit that exhibits oscillation with relatively great amplitude at some frequencies (e.g., resonant frequencies). Resonant circuits include discrete components that act as resonators when both inductors and capacitors are included. In such circuits, oscillations may be limited by the inclusion of resistance, either via a specific resistor component, or due to resistance of the inductor windings (e.g., a resistor-inductor-capacitor (RLC) circuit).

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

A radio frequency filtering circuitry includes a transformer-based resonator that permits or blocks certain frequencies in an output signal (e.g., an outgoing signal) so that the signal may be transmitted over a desired frequency. The transformer-based resonator may additionally or alternatively provide wideband impedance matching (e.g., within range of available impedances and over a wide range of frequencies) inside an amplifier. By way of example, the transformer-based resonator may be used for input matching, output matching, and/or inter-stage matching inside the amplifier. The resonator includes a first inductor (e.g., one or more coils), a second inductor (e.g., one or more coils), and a conductive loop. The conductive loop includes a resistor that may be a programmable variable resistor or a static resistor.

When a power source supplies current to the first inductor, the first inductor induces a current in the second inductor via a "transformer effect." Specifically, current in the first inductor may include two parts, a first even mode current and a first odd mode current. The first even mode current causes a second even mode current in the second inductor and the first odd mode current causes a second odd mode current in the second inductor. The first even mode current and the second even mode current travel in the same direction through the first inductor and the second inductor. On the other hand, the first odd mode current and the second odd mode current travel in opposite directions through the first inductor and the second inductor.

Since the first odd mode current through the first inductor and the second odd mode current through the second inductor have equal magnitude and flow in opposite directions, the currents may cancel each other out with respect to the conductive loop, such that there is no transfer of current in the conductive loop. As a result, current may not travel through the resistor coupled to the conductive loop. As such, and as discussed below, the conductive loop with the resistor may affect a frequency response associated with the even mode currents (e.g., a gain peak at a low frequency) to reduce an in-band ripple but may not affect the frequency response associated with the odd mode currents (e.g., the gain peak at the high frequency).

The first even mode current and the second even mode current through the first inductor and the second inductor generate an induced current in the conductive loop, which, due to at least in part to the resistor, reduces a first gain peak of an output signal (e.g., at a low frequency pole in the frequency response) to correlate with (e.g., approximately match) a second gain peak of the output signal. In this manner, the in-band ripple between the gain peaks may be reduced. As discussed above, the in-band ripple may refer to a frequency response for an operating region of the resonator that includes the first pole, the second pole, and in between the two poles. Otherwise, the resonator of the radio frequency filtering circuit, may produce the frequency response having the in-band ripple, which may cause poor error vector magnitude (EVM) and/or signal to noise ratio (SNR) values when an electronic device including the radio frequency filtering circuitry is transmitting the output signal. In some embodiments, the resonator may also include one or more shunt resistors and/or one or more series resistors. These resistors may improve performance of the resonator at least in part by reducing the peak difference across the frequency response, which includes the first peak gain and the second peak gain, further smoothing out the in-band ripple.

One aspect of the disclosure provides a radio frequency filtering circuit. The radio frequency filtering circuit includes a first inductor, a second inductor, and a conductive loop. The first inductor receives a first current and the second inductor inductively couples to the first inductor based on the first current. The first current induces a second current in the second inductor. The conductive loop inductively couples to at least one of the first inductor and the second inductor, inducing a third current in the conductive loop. The conductive loop adjusts the third current to reduce a first gain peak of an output signal to correlate to a second gain peak of the output signal.

Another aspect of the disclosure provides an electronic device having radio frequency filtering circuitry. The electronic device has a current source, a first coil coupled to the current source, a second coil, a conductive loop, and a resistor. The first coil generates a first even mode current and a first odd mode current in the first coil based on the current received from the current source. The second coil conducts a second even mode current induced by the first even mode current, in which the first even mode current flows through the first coil and the second even mode current flows through the second coil in a same direction. The second coil conducts a second odd mode current induced by the first odd mode current, in which the odd mode current flows through the first coil and the second odd mode current flows through the second coil in opposite directions. The conductive loop conducts an induced current, in which the induced current is induced by the first even mode current traveling through the first coil and the second even mode current traveling through the second coil. The resistor is coupled to the conductive loop and adjusts the induced current to reduce a first gain peak of a frequency response of the radio frequency filtering circuitry for an output signal to correlate to a second gain peak of the frequency response.

An additional aspect of the disclosure provides a transformer-based resonator. The transformer-based resonator includes a first inductor, a second inductor, a third inductor, and a variable resistor. The first inductor transmits a first even mode current and a first odd mode current when current is supplied to the first inductor. The second inductor transmits a second even mode current induced by the first even mode current that travels in the same direction as the first even mode current, and transmits a second odd mode current induced by the first odd mode current that travels in an opposite direction as the first odd mode current. The third inductor transmits an induced current that is induced by the first even mode current traveling through the first inductor and the second even mode current traveling through the second inductor. The variable resistor adjusts a coupling factor between the first inductor and the second inductor to reduce an in-band ripple between a first gain peak of a frequency response of the transformer-based resonator and the second gain peak of the frequency response of the transformer-based resonator.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
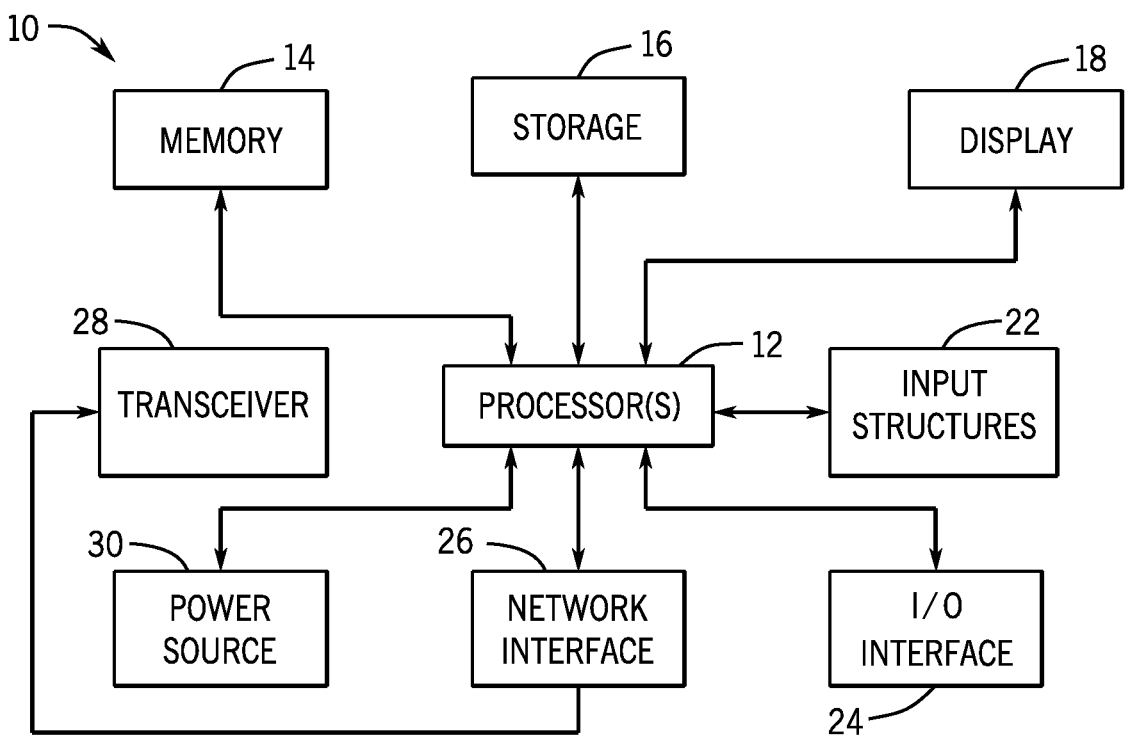
FIG. 1 is a block diagram of an electronic device, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Use of the term "approximately" or "near" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on).

As used herein, the term "frequency response" refers to gain of an output signal as a function of frequency across a range of frequencies (e.g., an operating region of a resonator filter). Additionally, as used herein, the term "frequency pole" refers to a frequency at which a transfer function of a system approaches a high gain or amplitude (e.g., infinity). By way of example, the frequency pole may include a particular frequency having a highest gain or amplitude, or relatively high gain or amplitude, of a frequency response for the resonator filter (e.g., a high frequency pole and a low frequency pole). As used herein, the term "peak," "peak gain," or "gain peak" refers to the highest gain or amplitude or relatively high gain or amplitude at a frequency pole (e.g., a gain peak at a high frequency pole). The relatively high gain at the particular frequency creates a peak with respect to the relatively low gain at other frequencies of the frequency response. Moreover, as used herein, the term "uneven gain" refers to a variance between two or more gain peaks (e.g., a gain difference between a gain peak at a low frequency pole and a gain peak at a high frequency pole). As used herein, the term "in-band ripple" refers to a ripple or variation in the frequency response for an operating region of a resonator filter that includes the first pole, the second pole, and in between the two poles. The ripple includes a contrast or variance in gain peaks between gain peaks at the frequency poles, with a dip in gain between the two gain peaks.

Radio frequency filtering circuitry may include transformer-based resonators, which may include multiple inductors, such as a primary (e.g., a first inductor) and a secondary inductor (e.g., a second inductor). If the primary inductor receives current, such as from a current source, the primary inductor may transfer the current to the second inductor, and thus, induce current in the secondary inductor. In particular, the current in the primary inductor may change as it flows through coils of the inductor and creates a changing magnetic field (e.g., magnetic flux) that induces the current into the secondary inductor. This transfer of current or electrical energy from one inductor to another due to a changing magnetic field may be referred to as a "transformer effect."

In some instances, some of the current from the primary inductor may not transfer to the secondary inductor. Instead, that current may not follow the intended path through the coils of the primary inductor. This portion of current may be referred to as leakage flux. The degree of transfer may be measured by various parameters including a coupling coefficient, k. The coupling coefficient may be adjusted or tuned, such as by circuit elements (e.g., resistors or the capacitors coupled to the first inductor and/or the second inductor), to vary filter parameters and bandwidth. However, adjusting the coupling coefficient, by itself, may not provide a tuning effect that reduces uneven gain of an output signal (e.g., in-band signal) at different frequency poles (e.g., a low frequency pole and a high frequency pole), resulting in a continued unexpected and/or undesired filter performance. As such, electronic devices with the radio frequency filtering circuitry may benefit from circuitry that provides the same or approximately the same gain (e.g., similar and within a gain threshold) of the output signal at the different frequency poles.

The disclosed embodiments may apply to a variety of electronic devices with the radio frequency filtering circuitry. In particular, any electronic device that transmits signals over a communication network may incorporate the disclosed radio frequency filtering circuitry to ensure that the signals are transmitted with similar gain over a target range of frequencies without comprising an intended amount of gain applied to the signals at the particular frequencies. With the foregoing in mind, a general description of suitable electronic devices that may include the disclosed radio frequency filtering circuitry is provided below.

With the foregoing in mind, there are many suitable communication devices that may include the disclosed radio frequency filtering circuitry described herein. Turning first to FIG. 1, an electronic device 10 according to an embodiment of the present disclosure may include, among other things, one or more processor(s) 12, memory 14, nonvolatile storage 16, a display 18, input structures 22, an input/output (I/O) interface 24, a network interface 26, a transceiver 28, and a power source 30. The various functional blocks shown in FIG. 1 may include hardware elements (including circuitry), software elements (including computer code stored on a computer-readable medium) or a combination of both hardware and software elements. It should be noted that FIG. 1 is merely one example of a particular implementation and is intended to illustrate the types of components that may be present in electronic device 10.

Figure 2:
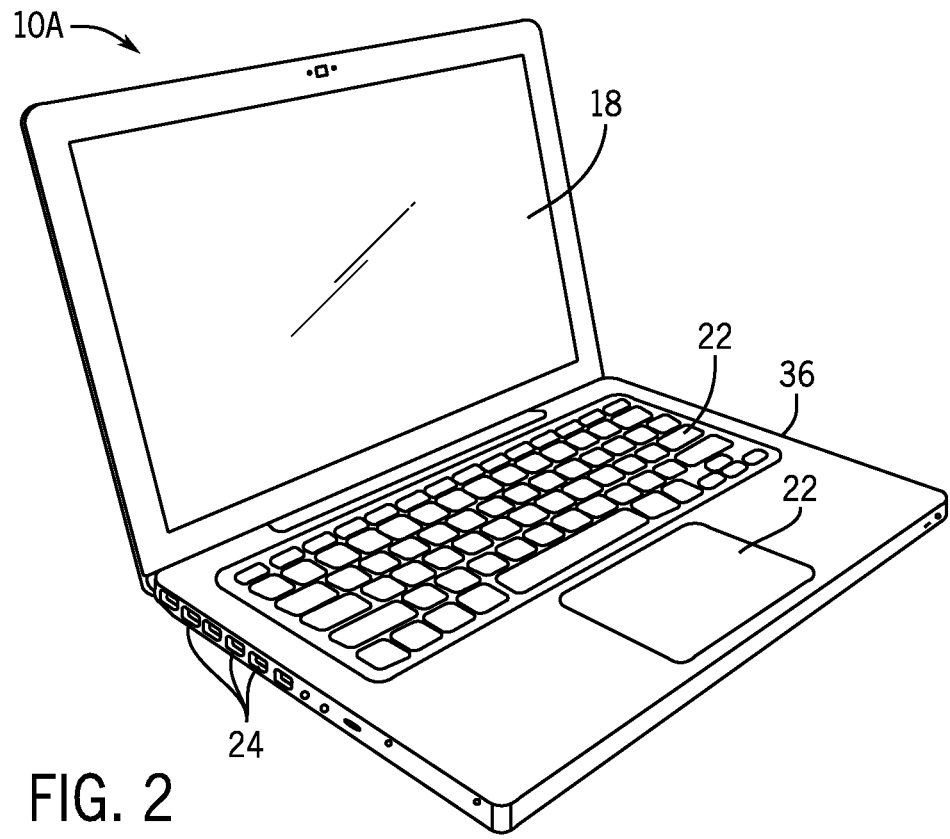
FIG. 2 is a perspective view of a notebook computer representing an embodiment of the electronic device of FIG. 1.
Figure 4:
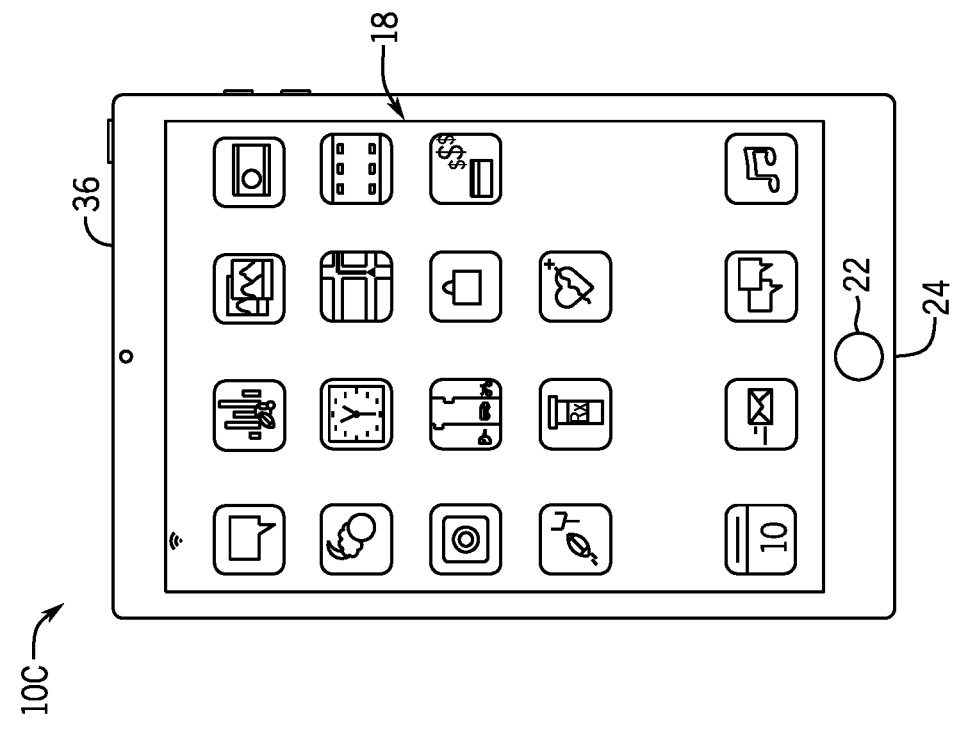
FIG. 4 is a front view of another handheld device representing another embodiment of the electronic device of FIG. 1.
Figure 3:
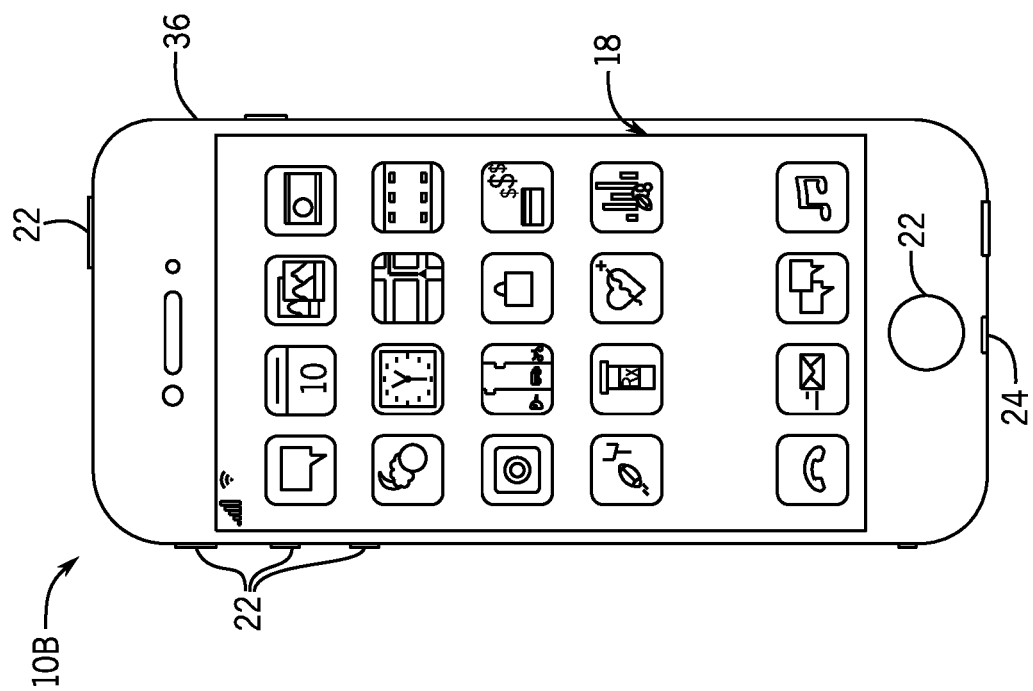
FIG. 3 is a front view of a handheld device representing another embodiment of the electronic device of FIG. 1.
Figure 5:
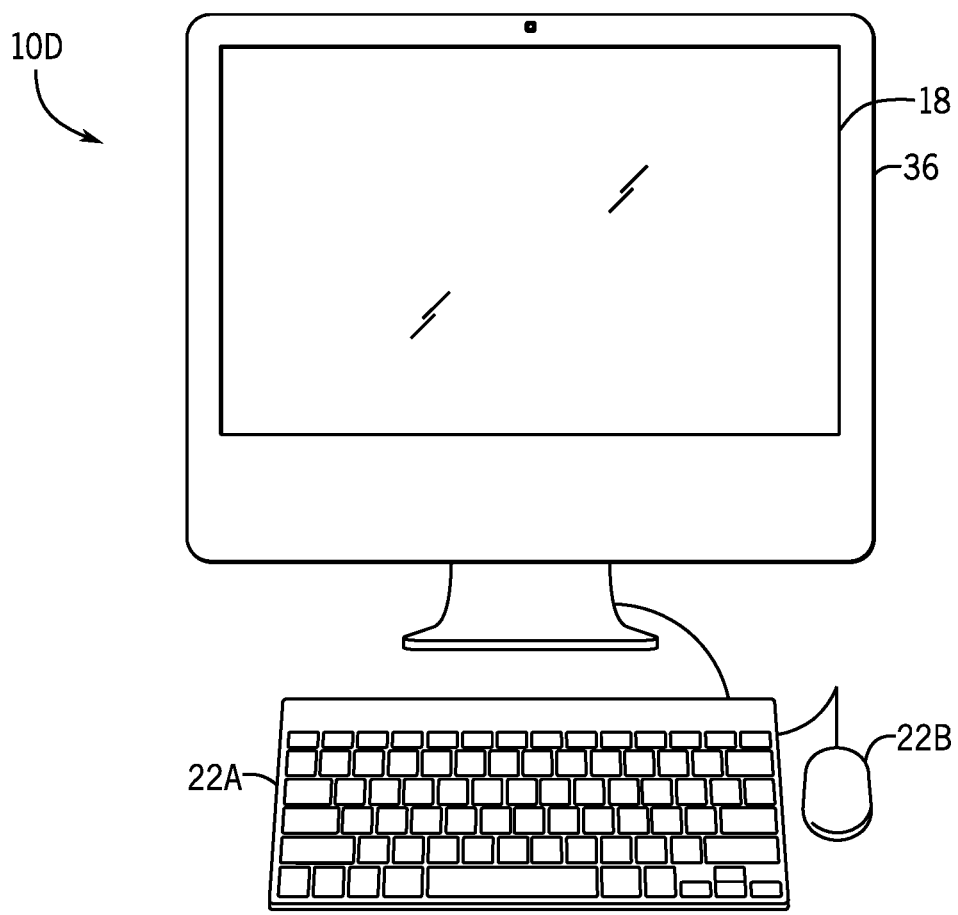
FIG. 5 is a front view of a desktop computer representing another embodiment of the electronic device of FIG. 1.
Figure 6:
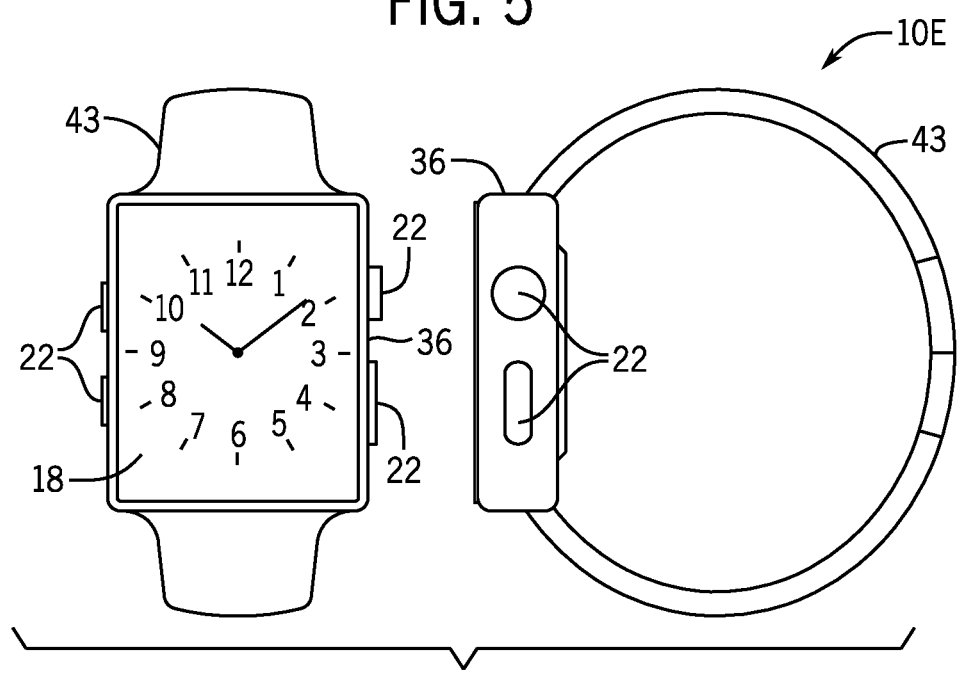
FIG. 6 is a front view and side view of a wearable electronic device representing another embodiment of the electronic device of FIG. 1.

By way of example, the electronic device 10 may represent a block diagram of the notebook computer depicted in FIG. 2, the handheld device depicted in FIG. 3, the handheld device depicted in FIG. 4, the desktop computer depicted in FIG. 5, the wearable electronic device depicted in FIG. 6, or similar devices. It should be noted that the processor(s) 12 and other related items in FIG. 1 may be generally referred to herein as "data processing circuitry." Such data processing circuitry may be embodied wholly or in part as software, software, hardware, or any combination thereof. Furthermore, the processor(s) 12 and other related items in FIG. 1 may be a single contained processing module or may be incorporated wholly or partially within any of the other elements within the electronic device 10.

In the electronic device 10 of FIG. 1, the processor(s) 12 may be operably coupled with a memory 14 and a nonvolatile storage 16 to perform various algorithms. Such programs or instructions executed by the processor(s) 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor(s) 12 to enable the electronic device 10 to provide various functionalities.

In certain embodiments, the display 18 may be a liquid crystal display (LCD), which may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. The network interface 26 may include, for example, one or more interfaces for a personal area network (PAN), such as a BLUETOOTH® network, for a local area network (LAN) or wireless local area network (WLAN), such as an 802.11x WI-FI® network, and/or for a wide area network (WAN), such as a $3^{rd}$ generation (3G) cellular network, universal mobile telecommunication system (UMTS), $4^{th}$ generation (4G) cellular network, long term evolution (LTE®) cellular network, long term evolution license assisted access (LTE-LAA) cellular network, $5^{th}$ generation (5G) cellular network, and/or New Radio (NR) cellular network. In particular, the network interface 26 may include, for example, one or more interfaces for using a Release-15 cellular communication standard of the 5G specifications that include the millimeter wave (mmWave) frequency range (e.g., 24.25-300 gigahertz (GHz)). The transceiver 28 of the electronic device 10, which includes a transmitter and a receiver, may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

In some embodiments, the electronic device 10 communicates over the aforementioned wireless networks (e.g., WI-FI®, WIMAX®, mobile WIMAX®, 4G, LTE®, 5G, and so forth) using the transceiver 28. The transceiver 28 may include circuitry useful in both wirelessly receiving and wirelessly transmitting signals (e.g., data signals, wireless data signals, wireless carrier signals, RF signals), such as a transmitter and/or a receiver. Indeed, in some embodiments, the transceiver 28 may include a transmitter and a receiver combined into a single unit, or, in other embodiments, the transceiver 28 may include a transmitter separate from a receiver. The transceiver 28 may transmit and receive RF signals to support voice and/or data communication in wireless applications such as, for example, PAN networks (e.g., BLUETOOTH®), WLAN networks (e.g., 802.11x WI-FI®), WAN networks (e.g., 3G, 4G, 5G, NR, and LTE® and LTE-LAA cellular networks), WIMAX® networks, mobile WIMAX® networks, ADSL and VDSL networks, DVB-T® and DVB-H® networks, UWB networks, and so forth. As further illustrated, the electronic device 10 may include the power source 30. The power source 30 may include any suitable source of power, such as a rechargeable lithium polymer (Li-poly) battery and/or an alternating current (AC) power converter.

In certain embodiments, the electronic device 10 may take the form of a computer, a portable electronic device, a wearable electronic device, or other type of electronic device. Such computers may be generally portable (such as laptop, notebook, and tablet computers), or generally used in one place (such as conventional desktop computers, workstations, and/or servers). In certain embodiments, the electronic device 10 in the form of a computer may be a model of a MacBook®, MacBook® Pro, MacBook Air®, iMac®, Mac® mini, or Mac Pro® available from Apple Inc. of Cupertino, Calif. By way of example, the electronic device 10, taking the form of a notebook computer 10A, is illustrated in FIG. 2 in accordance with one embodiment of the present disclosure. The depicted notebook computer 10A may include a housing or enclosure 36, a display 18, input structures 22, and ports of an I/O interface 24. In one embodiment, the input structures 22 (such as a keyboard and/or touchpad) may be used to interact with the computer 10A, such as to start, control, or operate a graphical user interface (GUI) and/or applications running on computer 10A. For example, a keyboard and/or touchpad may allow a user to navigate a user interface and/or application interface displayed on display 18.

FIG. 3 depicts a front view of a handheld device 10B, which represents one embodiment of the electronic device 10. The handheld device 10B may represent, for example, a portable phone, a media player, a personal data organizer, a handheld game platform, or any combination of such devices. By way of example, the handheld device 10B may be a model of an iPod® or iPhone® available from Apple Inc. of Cupertino, Calif. The handheld device 10B may include an enclosure 36 to protect interior components from physical damage and/or to shield them from electromagnetic interference. The enclosure 36 may surround the display 18. The I/O interfaces 24 may open through the enclosure 36 and may include, for example, an I/O port for a hardwired connection for charging and/or content manipulation using a standard connector and protocol, such as the Lightning connector provided by Apple Inc. of Cupertino, Calif., a universal serial bus (USB), or other similar connector and protocol.

The input structures 22, in combination with the display 18, may allow a user to control the handheld device 10B. For example, the input structures 22 may activate or deactivate the handheld device 10B, navigate user interface to a home screen, a user-configurable application screen, and/or activate a voice-recognition feature of the handheld device 10B. Other input structures 22 may provide volume control, or may toggle between vibrate and ring modes. The input structures 22 may also include a microphone that may obtain a user's voice for various voice-related features, and a speaker that may enable audio playback and/or certain phone capabilities. The input structures 22 may also include a headphone input that may provide a connection to external speakers and/or headphones.

FIG. 4 depicts a front view of another handheld device 10C, which represents another embodiment of the electronic device 10. The handheld device 10C may represent, for example, a tablet computer, or one of various portable computing devices. By way of example, the handheld device 10C may be a tablet-sized embodiment of the electronic device 10, which may be, for example, a model of an iPad® available from Apple Inc. of Cupertino, Calif.

Turning to FIG. 5, a computer 10D may represent another embodiment of the electronic device 10 of FIG. 1. The computer 10D may be any computer, such as a desktop computer, a server, or a notebook computer, but may also be a standalone media player or video gaming machine. By way of example, the computer 10D may be an iMac®, a MacBook®, or another similar device by Apple Inc. of Cupertino, Calif. It should be noted that the computer 10D may also represent a personal computer (PC) by another manufacturer. A similar enclosure 36 may be provided to protect and enclose internal components of the computer 10D, such as the display 18. In certain embodiments, a user of the computer 10D may interact with the computer 10D using various peripheral input structures 22, such as the keyboard 22A or mouse 22B (e.g., input structures 22), which may connect to the computer 10D.

Similarly, FIG. 6 depicts a wearable electronic device 10E representing another embodiment of the electronic device 10 of FIG. 1 that may be configured to operate using the techniques described herein. By way of example, the wearable electronic device 10E, which may include a wristband 43, may be an Apple Watch® by Apple Inc. of Cupertino, Calif. However, in other embodiments, the wearable electronic device 10E may include any wearable electronic device such as, for example, a wearable exercise monitoring device (e.g., pedometer, accelerometer, heart rate monitor), or other device by another manufacturer. The display 18 of the wearable electronic device 10E may include a touch screen display 18 (e.g., LCD, LED display, OLED display, active-matrix organic light emitting diode (AMOLED) display, and so forth), as well as input structures 22, which may allow users to interact with a user interface of the wearable electronic device 10E.

Figure 7:
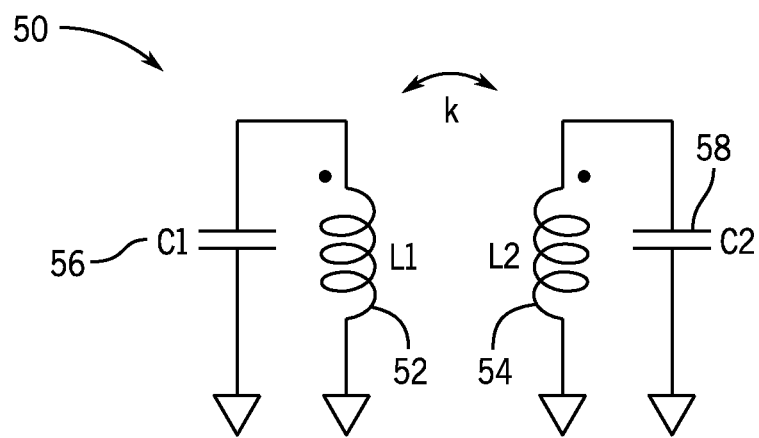
FIG. 7 is a circuit diagram of a transformer-based coupled resonator of radio frequency filtering circuitry.

With the foregoing in mind, FIG. 7 is a schematic diagram of a transformer-based coupled resonator 50 of radio frequency filtering circuitry. In general, a resonant circuit may include a first inductor and a second inductor. These inductors may form a transformer when they are placed too close together and current is transferred between them. That is, current in the first inductor may induce or transfer electrical energy (e.g., magnetic flux) from the first inductor to the second inductor upon receiving the current through the first inductor. The coupling of capacitors to each of the inductors in the resonant circuit may be referred to as magnetic coupled resonators, in which energy oscillates between coils of the inductors (e.g., the transformer) and the capacitors that store energy in an electric field at a certain resonance frequency. Often, an offset between the first inductor and the second inductor may be used to tune parameters of the transformer, such as a coupling coefficient, k. In some instances, the capacitors and/or resistors of the resonant circuit may be used to tune the coupling coefficient. Tuning may allow changing the bandwidth of the filter (e.g., wider range or narrower range of frequencies) and/or an in-band ripple that is created by uneven peak gains at multiple frequency poles. However, adjusting the coupling coefficient may result in uneven gain of an output signal at the multiple frequency poles that may result in unexpected filter performance.

As shown in the depicted embodiment, the transformer-based coupled resonator 50 has a first inductor 52 ($L_1$), a second inductor 54 ($L_2$), a first capacitor 56 ($C_1$), and a second capacitor 58 ($C_2$). The first inductor 52 may be coupled to the first capacitor 56 and the second inductor 54 may be coupled to the second capacitor 58. Each of these inductor-capacitor (LC) arrangements may function as an LC resonant circuit that stores energy oscillating at the circuit's resonant frequency. The LC circuit may generate signals at a particular frequency or pass signals through at the particular frequency (e.g., bandpass filter).

Generally, the resonator 50 may include coupling elements that facilitate wideband filtering. The coupling elements may include components that allow coupling, or the transfer of energy from one inductive circuit segment (e.g., one or more coils of the first inductor 52) to another inductive circuit segment (e.g., another one or more coils of the second inductor 54) of the resonator 50. The coupling elements may be capacitive and/or magnetic. The capacitive coupling elements may provide the transfer of energy between the circuit segments as a result of a change in an electric field induced by a voltage. The magnetic coupling elements may provide the transfer energy as a result of a change in a magnetic: field induced by a current flow.

As shown, the resonator 50 includes capacitors on each inductor side, such as the first capacitor 56 coupled to the first inductor 52 and the second capacitor 58 coupled to the second inductor 54. When current is applied to the resonator 50, these coupling elements may form a magnetic coupled resonator. As will be discussed in detail with respect to FIGS. 9A-9C, adjusting the coupling coefficient of the resonator 50 may allow adjusting bandwidth of the filter and/or an in-band ripple of a frequency response of the output signal through the resonator 50.

Figure 8:
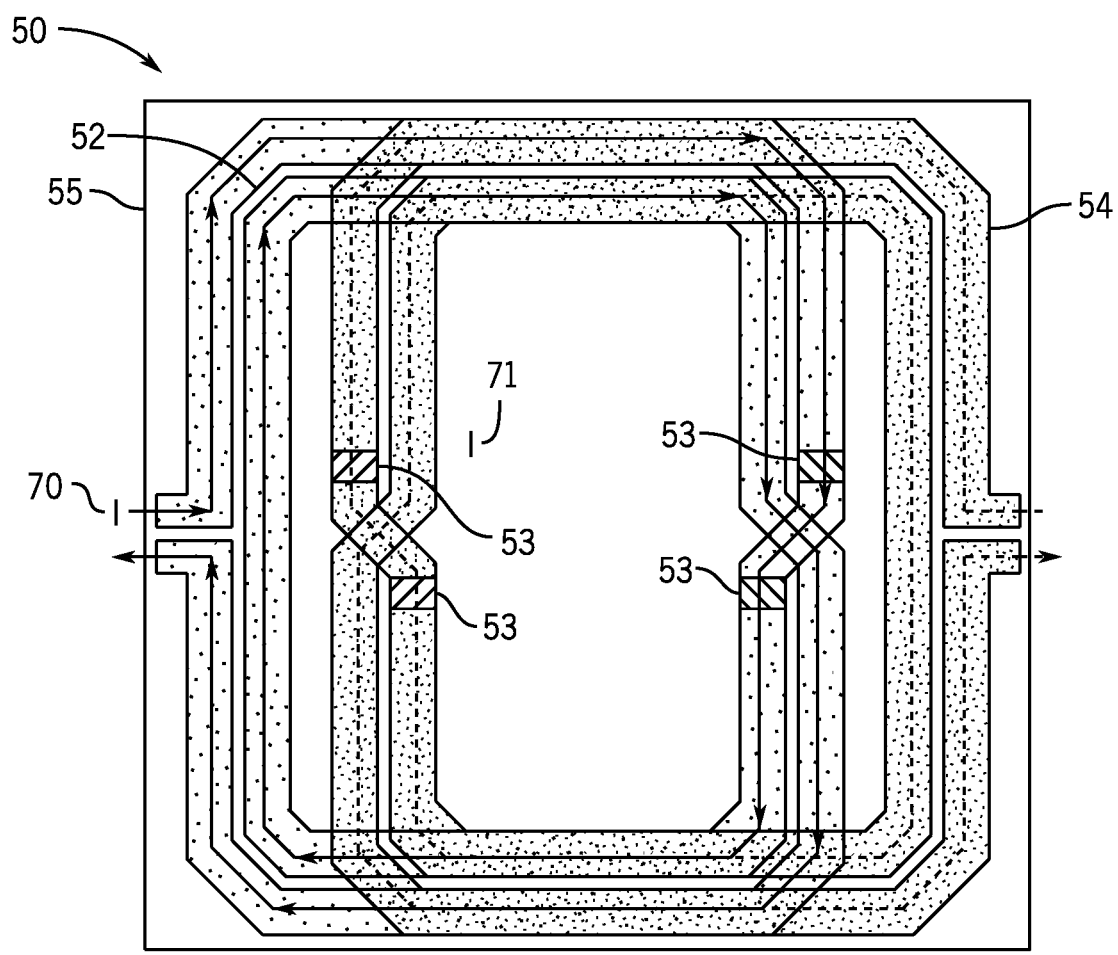
FIG. 8 is a schematic diagram of the resonator of FIG. 7 implemented on a silicon chip.

FIG. 8 depicts the resonator 50 implemented on a silicon chip. As shown, the resonator 50 may be formed using the first inductor 52 (indicated by a light dot pattern) and the second inductor 54 (indicated by a dark dot pattern) arranged in a multi-layer stack architecture on a printed circuit board 55 (PCB). Although the following discussion describes the resonator 50 implemented on the PCB, which represents a particular embodiment, the resonator 50 may instead be implemented on the silicon chip or an integrated circuit. The first inductor 52 and/or the second inductor 54 may be disposed, such as by mounting on and/or etching, onto a first (e.g., lower) layer of the PCB 55. Here, the first inductor 52 is disposed (e.g., positioned) on the first layer of the PCB 55 while the second inductor 54 is disposed on a second (e.g., higher or lower) layer of the PCB 55. In some embodiments, a portion of coils of the first inductor 52 may be disposed on the first layer while another portion of coils of the first inductor 52 is disposed on the second layer. In such embodiments, these portions may be coupled using vias 53, such that current flowing (e.g., traveling) through the first inductor 52 may flow between the two layers without disruption. Similarly, the second inductor 54 may also include a portion of its coils disposed on the second layer while another portion of its coils is disposed on another layer (e.g., a third layer that is higher than the second layer). The second inductor may also include vias 53 to couple these portions together. In some embodiments, circuit segments or components of the resonator 50 may be separated onto separate PCBs. That is, the first inductor 52 may be positioned on a first PCB while the second inductor 54 is positioned on a second PCB, which is coupled to the first PCB.

Figure 9A:
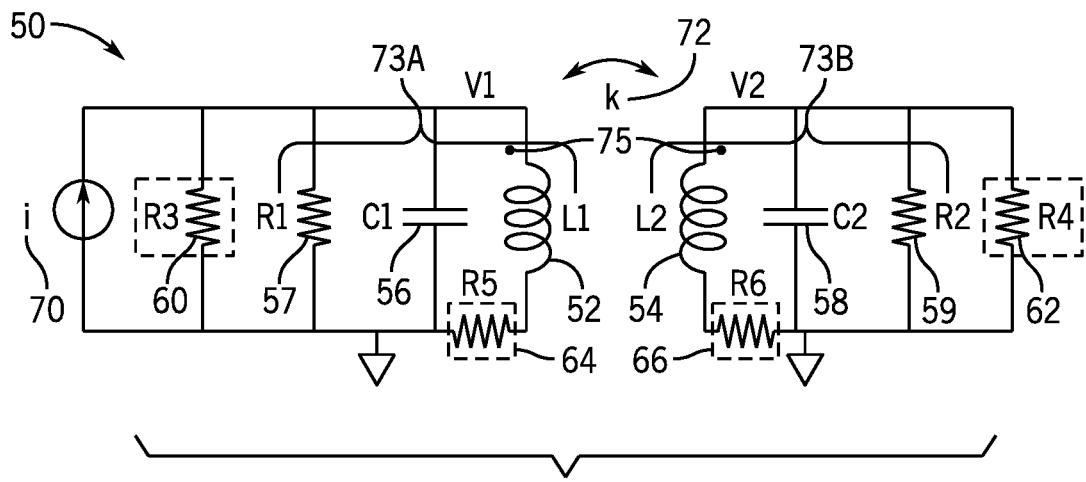
FIG. 9A is a circuit diagram of the resonator of FIG. 7 with series resistors and shunt resistors.
Figure 9B:
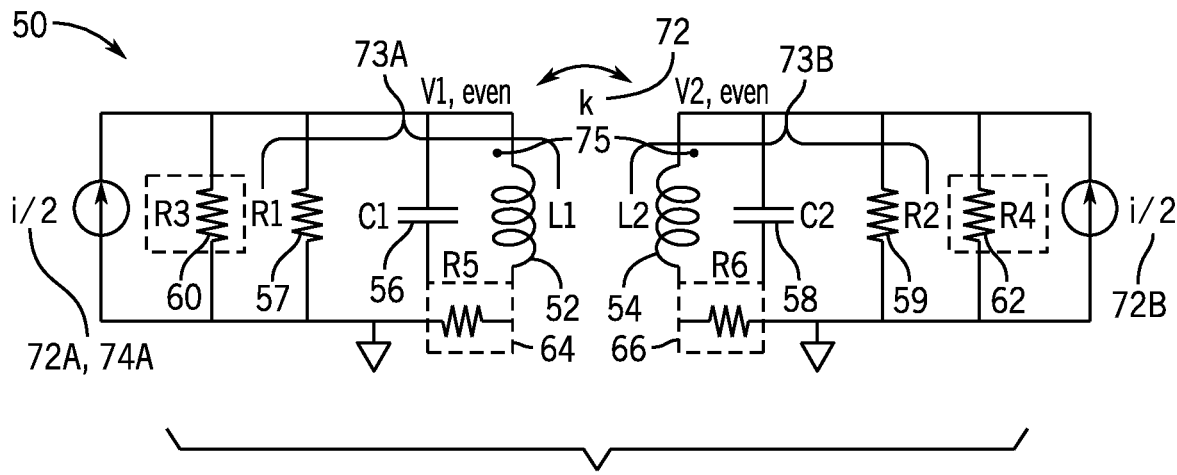
FIG. 9B is a circuit diagram of the resonator of FIG. 9A showing even mode current flowing through the resonator.

In embodiments with the even mode current, and as discussed in detail with respect to FIG. 9B, when current 70 (I) is applied to the first inductor 52 in the depicted stacked architecture of the resonator 50, the current may flow through the first inductor 52 in a direction indicated by the solid line arrows. In particular, the direction indicated by the arrows illustrates that the current 70 flows in a first direction through the coils of the first inductor 52. Upon receiving the current 70, the first inductor 52 may induce (e.g., generate, conduct, or transmit) current 71 in the second inductor 54 that flows in the same direction through the second inductor 54. In embodiments with the odd mode current, and as discussed in detail with respect to FIG. 9C, when the current 70 is applied to the first inductor 52, the current 70 may flow through the first inductor 52 in the first direction and induce current 71 in the second inductor 54. In particular, the direction indicated by the dash line arrows illustrates that upon receiving the current 70, the first inductor 52 may induce current 71 in the second inductor 54 that flows in a second direction that is opposite to the first direction through the second inductor 54. Although the following descriptions describe the current 70 flowing in the first direction through the first inductor 52, which represent a particular embodiment, the current 70 may instead flow in a different or opposite direction (e.g., the second direction).

As a result of the transformer effect, the first inductor 52 may induce current in the second inductor 54. Although not shown, the induced current through the second inductor 54 may flow similarly to the flow in the first inductor 52. Specifically, and as will be described in detail with respect to FIG. 9B and FIG. 9C, the induced current may flow in the same direction through the second inductor 54 when the current 70 is an even mode current, or in an opposite direction through the second inductor 54 when the current 70 is odd mode current.

Furthermore, and as previously discussed, amplification or gain of an output signal (e.g., transmission signal) at various frequencies and/or frequency poles may vary. In particular, a frequency response of the output signal through the resonator 50 may indicate that the gain of the output signal at these various frequencies and/or frequency poles may be different (e.g., a relatively high gain at a low frequency pole and a relatively low gain at a high frequency pole), such that gain peaks at the respective frequency poles are uneven, creating an "in-band ripple effect." The resonator 50 of the radio frequency filtering circuit may result in the frequency response having the in-band ripple, which may cause poor EVM and SNR values when the electronic device 10 is transmitting the output signal.

To improve filtering performance, adjusting various filter parameters may enable adjusting the gain (e.g., increasing or decreasing the gain) of the output signal at the particular frequencies and/or the frequency poles. By adjusting the gain, the overall frequency response may become even and smooth, removing the in-band ripple. To illustrate components that may tune the filter parameters, FIG. 9A depicts the resonator 50 with capacitors, resistors, series resistors, and shunt resistors.

As shown in FIG. 9A, the resonator 50 may include the first inductor 52 ($L_1$), the second inductor 54 ($L_2$), the first capacitor 56 ($C_1$), and the second capacitor 58 ($C_2$). Here, the first capacitor 58 ($C_1$) may be in parallel with a first resistor 57 ($R_1$) and a first shunt resistor 60 ($R_3$), while the second capacitor 58 may be in parallel with a second resistor 59 ($R_2$) and a second shunt resistor 62 ($R_4$). Moreover, a first series resistor 64 ($R_5$) may be in series with the first inductor 52 and the first capacitor 56. Similarly, a second series resistor 66 ($R_6$) may be in series with the second inductor 54 and the second capacitor 58. Although the depicted embodiment illustrates and describes the resonator 50 with both the shunt resistors 60, 62 and the series resistors 64, 66 for tuning the resonator 50 of the radio frequency filtering circuitry, the resonator 50 may be implemented without at least some of these resistors, such as without the shunt resistors 60, 62, and/or without the series resistors 64, 66. In some embodiments, each RLC circuit of the resonator 50, such as a first RLC circuit 73A that includes the first inductor 52, the first capacitor 56, and the first resistor 57, and a second RLC 73B circuit that includes the second inductor 54, the second capacitor 58, and the second resistor 59, may be independently implemented without the shunt resistors 60, 62, and/or without the series resistors 64, 66.

As will be discussed in detail with respect to FIG. 10, the shunt resistors 60, 62 and/or the series resistors 64, 66 may adjust operation of the resonator 50 of the radio frequency filtering circuitry. Additionally or alternatively to adjusting the operation of the resonator 50 via the shunt resistors 60, 62 and/or the series resistors 64, 66, the first resistor 57, the second resistor 59, and/or the capacitors 56, 58 may adjust the operation of the resonator 50. In particular, and as will be described herein, tuning filter parameters via the first resistor 57, the second resistor 59, the shunt resistors 60, 62, the series resistors 64, 66, and/or the capacitors 56, 58, may adjust a network quality factor (Q factor) and/or the coupling coefficient. The Q factor includes the source/load impedance ($R_1$). As will be discussed in detail with respect to FIGS. 11A-C, the Q factor may be finite and is associated with the coupling coefficient. Merely adjusting the coupling coefficient using the first and second resistor 57, 59, the shunt resistors 60, 62, the series resistors 64, 66, and/or the capacitors 56, 58, may not effectively reduce or remove the in-band ripple in the frequency response of the output signal through the resonator 50.

As shown, a power source may supply current 70 or voltage (e.g., the input signal) to the resonator 50. In the depicted embodiment, the power source provides the current 70 to the first inductor 52. A portion of the current 70 may transfer to the second inductor 54 by the transformer effect, inducing current into the second inductor 54, as previously described. When the current 70 transfers from the first inductor 52 to the second inductor 54, the current 70 may flow through the coils of the second inductor 54 in the same direction or in opposite directions with respect to the current 70 flowing through the coils of the first inductor 52.

To illustrate, FIG. 9B depicts the resonator 50 with even mode current. The total current 70 supplied to the resonator 50 may flow through the first inductor 52 and may include two parts, an even mode current and an odd mode current. As shown, the total current 70 through the first inductor 52 splits into a first even mode current 72A (i/2) and a first odd mode current 74A (i/2) that each have half magnitude of the total current 70. The first even mode current 72A causes a second even mode current 72B in the second inductor 54 that has the half magnitude and flows in the same direction as the first even mode current 72A through the first inductor 52 (e.g., as indicated by the current flow arrows pointing in the same direction). That is, current may flow through the coils of the first inductor 52 in a particular direction, and when the current transfers to the second inductor 54, it may also flow through the coils of the second inductor 54 the same direction.

A polarity dot 75 placed next to the coil may indicate the polarity associated with the respective inductors 52, 54. The direction of the current 70 may be determined or referenced with respect to the polarity dot 75. The first even mode current 72A may flow into the polarity dot 75 for the first inductor 52 (e.g., primary current through a primary side of transformer) and the second even mode current 72B may also flow into the polarity dot 75 for the second inductor 54 (e.g., secondary current through a secondary side of the transformer). On the other hand, the first even mode current 72A may flow through the first inductor 52 and out of the polarity dot 75 and the second even mode current 72B may flow through the second inductor 54 and out of the polarity dot 75. In both cases, the first even mode current 72A and the second even mode current 72B flow through their respective inductors 52, 54 in the same direction.

In the depicted embodiment, the even mode current 72A through the first inductor 52 causes the even mode current 72B to flow through the second inductor 54. As previously mentioned, the even mode currents 72A, 72B flow in the same direction (both towards the polarity dot 75 or both out of the polarity dot 75). Since both the first even mode current 72A and the second even mode current 72B flow in the same direction, the second even mode current 72B may provide positive feedback to the first even mode current 72A (e.g., adding an equal and proportional signal in the same direction), resulting in high gain of the output signal. This amplification my cause larger oscillation between gain peaks associated with the even mode current and the gain peaks associated with the odd mode current, resulting in a larger in-band ripple effect.

Figure 9C:
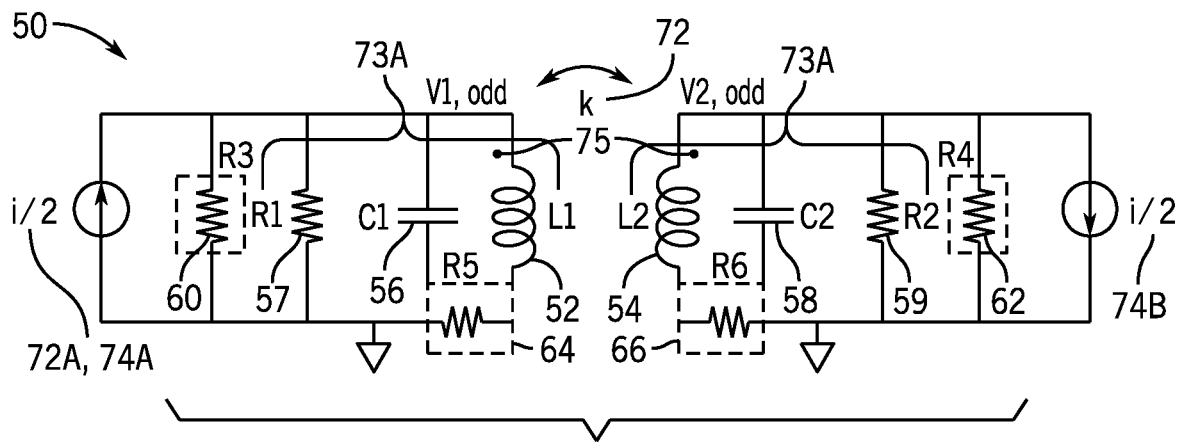
FIG. 9C is a circuit diagram showing the resonator of FIG. 9A showing odd mode current flowing through the resonator.

When the current transfers from the first inductor 52 to the second inductor 54 through the transformer effect, the odd mode currents may flow in an opposite direction (based at least partly on the polarity of the inductors 52, 54). Specifically, the first odd mode current 74A may flow into the polarity dot 75 for the first inductor 52 and the second odd mode current 74B may flow through the second inductor 54 and out of the polarity dot 75, or vice versa. That is, the first odd mode current 74A and the second odd mode current 74B flow through the first inductor 52 and the second inductor 54 in opposite or different directions with respect to the polarity dot 75. To illustrate, FIG. 9C depicts the resonator 50 with odd mode current. As shown, the first odd mode current 74A (i/2) of the total current 70 supplied to the resonator 50 may flow through the first inductor 52 in a particular direction and the second odd mode current 74B (i/2) may flow through the second inductor 54 in the same direction (e.g., as indicated by the current flow arrows pointing in opposite directions). Specifically, the first odd mode current 74A causes a second odd mode current 74B in the second inductor 54 that has the half magnitude and flows in the opposite direction as the first odd mode current 74A. By way of example, current may flow through the coil of the first inductor 52 in a particular direction and when the current transfers to the second inductor 54, it may be induced to flow in the opposite direction.

An even mode analysis and an odd mode analysis may be performed for the resonator 50 to determine tuning parameters. Although the following discussions and equations describe a symmetric transformer-based resonator, such that the capacitors, inductors, and/or resistors of the first RLC circuit 73A correlate to the characteristics of the capacitors, inductors, and/or resistors of the second RLC circuit 73B (e.g., $C_1=C_2$, $L_1=L_2$, $R_1=R_2$), which represents a particular embodiment, the capacitors, inductors, and/or resistors on either side may instead have different or varying characteristics between the first RLC circuit 73A and the second RLC circuit 73B (e.g., $C_1 \neq C_2$, $L_1 \neq L_2$, $R_1 \neq R_2$). That is, the description of the equations and circuits of FIGS. 9A-9C and 11A-11C do not necessarily have to match up to the depicted circuits of 9A-9C and 11A-11C that represent particular embodiments. Here, an even mode voltage and an odd mode voltage for the first RLC circuit 73A of the resonator 50 that includes the first inductor 52, the first capacitor 56, and the first resistor 57, may be described using the following equation:

$$V_1, \text{even} = V_2, \text{even} = i/2 * \frac{1}{1/R1 + jwC1 + \frac{1}{(jwL1)(1+k)}} \quad \text{(Equation 1)}$$

$$V_1, \text{odd} = -V_2, \text{odd} = i/2 * \frac{1}{1/R1 + jwC1 + \frac{1}{(jwL1)(1-k)}} \quad \text{(Equation 2)}$$

In these equations, $V_1$, corresponds to an input voltage (e.g., of an input signal) and $V_2$ corresponds to an output voltage (e.g., of an output signal). By way of example, $V_1$, even corresponds to an even mode input voltage for the first segment and $V_2$, even corresponds to an even mode output voltage for the second RLC circuit 73B of the resonator 50 that includes the second inductor 54, the second capacitor 58, and the second resistor 59. As previously mentioned, i/2 corresponds to the first even mode current 72A, $R_1$ corresponds to the first resistor 57 (e.g., a real value resistance), and $C_1$ corresponds to the first capacitor 56. w corresponds to frequency, j corresponds to an imaginary unit (e.g., an imaginary value resistance, such as reactance impedance of an inductor or a capacitor), and k corresponds to a coupling factor or coefficient. Although the equation descriptions herein are described with respect to the first RLC circuit 73A of the resonator 50, the equations may additionally or alternatively apply respective parameters of the second RLC circuit 73B of the resonator 50 circuit.

By adding the even mode and odd mode voltages, the input voltage and the output voltage may be expressed as:

$$\frac{V1}{i} = i/2 * \left( \frac{1}{1/R1 + jwC1 + \frac{1}{(jwL1)(1+k)}} + \frac{1}{1/R1 + jwC1 + \frac{1}{(jwL1)(1-k)}} \right) \quad \text{(Equation 3)}$$

$$\frac{V2}{i} = i/2 * \left( \frac{1}{1/R1 + jwC1 + \frac{1}{(jwL1)(1+k)}} - \frac{1}{1/R1 + jwC1 + \frac{1}{(jwL1)(1-k)}} \right) \quad \text{(Equation 4)}$$

Equations 3 and 4 may be used to determine one or more frequency poles, or one or more gain peaks of the output signal at one or more particular frequencies. Although the following descriptions describe two frequency poles of a frequency response, such as a low frequency pole and a high frequency pole, the systems, methods, and equations described herein may be used to determine any suitable number of frequency poles (e.g., one, two, four, seven, and so forth). As previously mentioned, a "pole" may refer to a "gain peak," such as a relatively highest gain with respect to gain (e.g., frequency response) of the output signal at other frequencies. The two poles correspond to a first frequency, $w_1$, and a second frequency, $w_2$, which may be defined as:

$$w_1 = \frac{1}{\sqrt{C1*L1*(1+k)}} \quad \text{(Equation 5)}$$

$$w_2 = \frac{1}{\sqrt{C1*L1*(1-k)}} \quad \text{(Equation 6)}$$

Moreover, a network quality factor, Q factor, may be defined as:

$$Q = R_1 * C_1 * w_0 \quad \text{(Equation 7)}$$

where $w_0$ corresponds to a geometric mean frequency, defined as:

$$w_0 = \sqrt{w1 w2} = \frac{1}{\sqrt{C1 * L1 * (1 - k^2)}} \quad \text{(Equation 8)}$$

As previously mentioned, the coupling coefficient, k, may indicate a ratio or a measurement of inductive coupling between coils of two inductors. The coupling coefficient is expressed as a value between 0 and 1, where 0 indicates no inductive coupling and 1 indicates ideal inductive coupling (e.g., no flux leakage). By way of example, when the coupling coefficient is 0.5 or above, the two coils may be well-coupled. When the coupling coefficient is below 0.5, then the two coils may be not be well-coupled (e.g., more flux or current leakage than expected).

The gain peaks of the output signal at a particular frequency (e.g., the first frequency pole) and at another particular frequency (e.g., the second frequency pole) may vary, such that the frequency response of the resonator 50 may exhibit an in-band ripple between the gain peaks. The following equation may describe an ideal filter criteria to flatten or smooth out the ripple to a maximum flat response:

$$kQ = 1 \quad \text{(Equation 9)}$$

That is, to reduce or minimize the in-band ripple effect, the product of the Q factor and coupling coefficient should be 1 or approximately 1. Varying the value of the resistor (e.g., the first resistor 57) and/or the capacitor (e.g., the first capacitor 56) may adjust the product of the Q factor and/or the coupling coefficient. In some cases, adjusting the Q factor may be primarily performed by adjusting the resistor, as a resonant frequency of the resonator 50 may vary with adjustments to the capacitor. By way of example, if the coupling coefficient is 0.5, such that the coils of the first inductor 52 and the second inductor 54 are well-coupled, the Q factor may be adjusted to 2 to generate the maximum flat response (e.g., effectively reducing or minimizing the in-band ripple). By way of another example, when the coupling coefficient is 0.5 and the Q factor is greater than 2, the disparity between the gain peaks of the in-band ripple may increase. On the other hand, when the Q factor is less than 2, the two-pole frequency response may degenerate to a single pole frequency response, and thus lose its bandwidth extension (e.g., wideband filter) benefit.

As previously discussed, the shunt resistors 60, 62 and/or the series resistors 64, 66 of FIG. 9A-9C may also adjust filter parameters (e.g., the network Q factor (Q) and/or the coupling coefficient (k)) of the resonator 50. In particular, implementing the resonator 50 with the shunt resistors 60, 62 and/or the series resistors 64, 66 may lower gain peaks (e.g., decrease gain) of the output signal at the two frequency poles, thus evening out the in-band ripple.

By way of example, the first frequency pole at a relatively low frequency may correspond to an even mode current and the second frequency pole at a relatively high frequency may correspond to an odd mode current. The frequency pole at the low frequency corresponds to an even mode current. In particular, a gain peak at the low frequency pole may be relatively higher than a gain peak at the high frequency pole. As previously mentioned, since both the first even mode current 72A and the second even mode current 72B flow in the same direction, the second even mode current 72B may provide positive feedback to the first even mode current 72A that results in high gain of the output signal, the relatively higher gain peak corresponds to the frequency pole at the lower frequency. On the other hand, since the first odd mode current 74A and the second odd mode current 74B flow in the opposite direction, resulting in relatively low gain of the output signal, the relatively lower gain peak corresponds to the frequency pole at the higher frequency.

Figure 10:
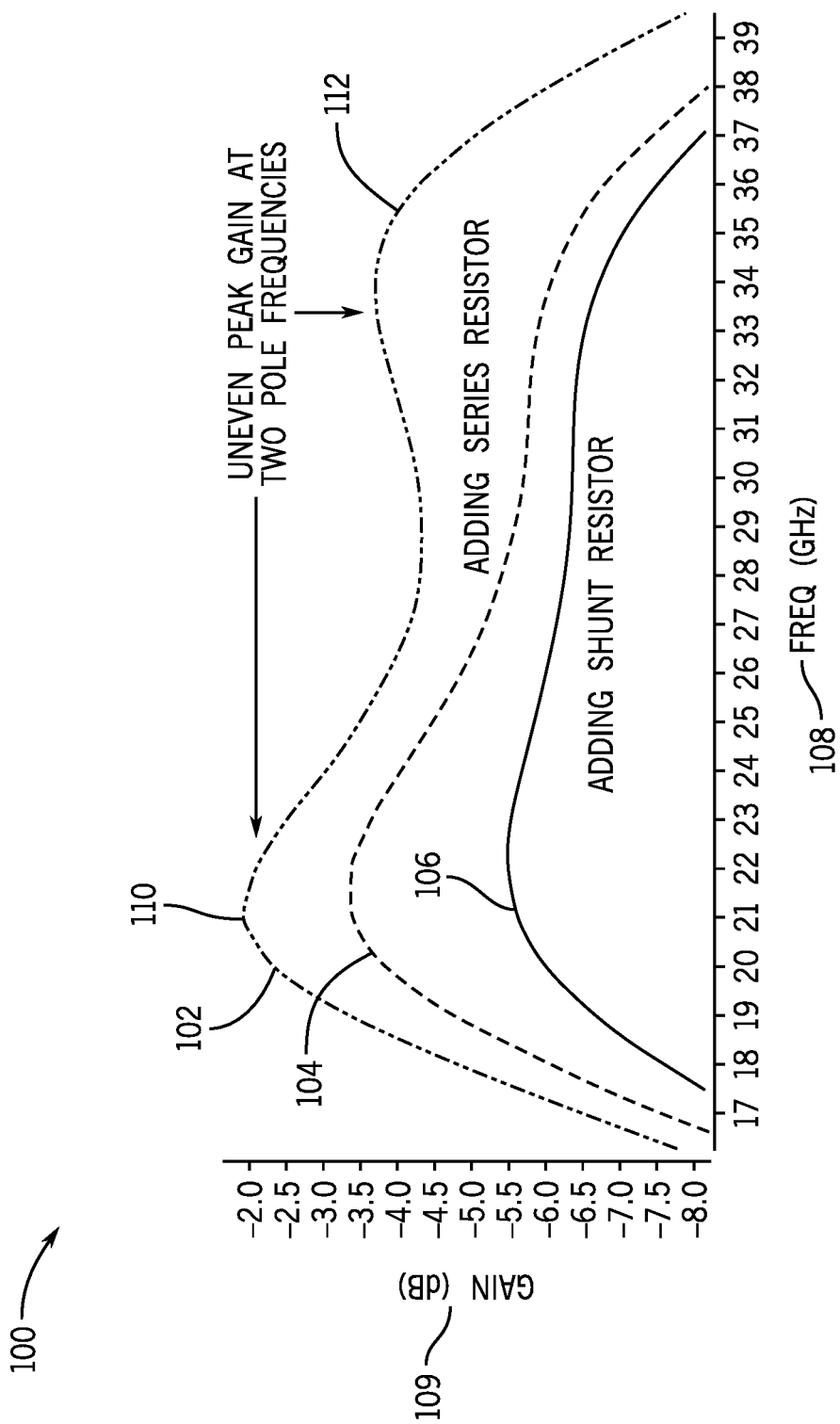
FIG. 10 is a graph illustrating frequency poles of a frequency response of the resonator of FIG. 9A.

To illustrate, FIG. 10 depicts a graph 100 illustrating gain peaks of the output signal at a first frequency pole 110 and a second frequency pole 112 (e.g., a two-pole frequency response). A first curve 102 illustrates the frequency response of the output signal through the resonator 50 without shunt or series resistors (e.g., the RLC circuits 73A, 73B of the resonator 50 of FIGS. 9A-9C). Moreover, a second curve 104 illustrates the frequency response of the resonator 50 implemented with one or more series resistors, such as the first and the second series resistors 64, 66. Additionally, a third curve 106 illustrates the frequency response of the resonator 50 implemented with one or more shunt resistors, such as the first and the second shunt resistors 60, 62. The graph 100 may illustrate the output signal over a frequency range 108 in hertz (Hz) (x-axis) and a corresponding gain 109 in decibels (dB) (y-axis), indicating the frequency response of the output signal through the resonator 50 of the radio frequency filtering circuitry. The gain 109 indicates reflection and/or transmission characteristics of the output signal in a frequency domain. The gain 109 may be proportional to the gain of the output signal at a particular frequency, such that gain values increase (e.g., from −8 dB to 2 dB) as the gain of the output signal increases. That is, a high gain peak may be associated with a high gain value (e.g., approximately −2 dB). A low gain value (e.g., approximately −8 dB) may correspond to more reflection or loss of the output signal. Thus, maintaining high gain at the various frequencies and/or frequency poles may be beneficial to transmit the output signal at an intended power level.

As shown by the first curve 102, the gain peak at the first frequency pole 110 and the second frequency pole 112 have different gain values, creating an in-band ripple between the gain peaks of the respective frequency poles 110, 112. To smooth out the ripple, the resonator 50 may be implemented with the series resistors 64, 66. As shown by the second curve 104, adding the series resistors 64, 66 may smooth out some of the in-band ripple, such that there is less disparity between the respective gain peaks at the first frequency pole 110 and the second frequency pole 112. However, the gain of the overall frequency response also decreases. That is, the peaks may become relatively more even (e.g., than without the series resistors 64, 66) by reducing gain contrast between the peaks, but with a lower overall gain at each of the peaks of the respective frequency poles 110, 112 and between the peaks. Lower gain peaks correspond to higher reflection of the output signal, such that there is relatively greater output signal loss.

Additionally or alternatively to adding the series resistors 64, 66, the resonator 50 may be implemented with the shunt resistors 60, 62. As shown by the third curve 106, the shunt resistors 60, 62 may further smooth out some of the in-band ripple, such that there is less disparity between the respective peak gains at the first frequency pole 110 and the second frequency pole 112. However, the gain of the overall frequency response, including the frequency pole, also decreases. That is, the peaks may become relatively more even (e.g., than without the shunt resistors 60, 62) by reducing gain contrast between the peaks but with a lower overall gain at each of the peaks of the respective frequency poles 110, 112. As previously mentioned, the lower gain peaks may indicate higher reflection of the output signal at the respective frequency poles 110, 112, such that there is relatively greater output signal loss. Thus, the shunt resistors 60, 62 and/or the series resistors 64, 66, may reduce the in-band ripple effect of the output signal, but may compromise the gain at various frequencies, including the first frequency pole 110 and the second frequency pole 112.

In some instances, simply adjusting the coupling coefficient may not provide a tuning effect that reduces uneven gain of an output signal. As such, the uneven gain peaks caused by the even and odd mode currents through the transformer-based resonator 50, as previously discussed, may be difficult to reduce.

The gain peak at the first frequency pole 110 (e.g., low frequency pole) is associated with a Q factor of a total sum of the inductance and the coupled inductance (e.g., a coupling gain peak). On the other hand, the gain peak at the second frequency pole 112 (e.g., high frequency pole) is associated with the leakage inductance Q factor. At higher frequencies, the leakage inductance may have a lower Q factor due to less efficient magnetic flux loop. The resonator 50 of the radio frequency filtering circuit that results in the frequency response having uneven gain peaks that create sharp peaking and the in-band ripple, may cause poor EVM and SNR values when the electronic device 10 is transmitting the output signal. This may result in filtering instabilities and/or an unstable output signal. Tuning the resonator 50 by tuning the capacitors 56, 68 and/or the resistors 60, 62 (e.g., "de-Qing" the output signal), and/or adding the shunt resistors 60, 62 and/or the series resistors 64, 66 to the resonator 50, to address the in-band ripple, may result in transmitting the output signal with a compromised (e.g., excessively and/or undesirably reduced) gain.

Transmitting the output signal with lower gain may result in the electronic device 10 communicating a degraded signal due to an increase in reflection loss, and by extension, a degraded form of wireless communication. In some instances, the gain peak may fall below a predefined threshold for transmitting the output signal from the transceiver 28. By way of example, a threshold gain peak may include a gain value or range of values that allow an antenna of the transceiver 28 to transmit the output signal with a predefined power (e.g., low reflection), indicating reliable or expected quality of wireless communication. That is, if the gain of the output signal at a particular frequency is below the threshold, the electronic device 10 having the radio frequency filtering circuit with the resonator may be unable to transmit the output signal in an expected manner.

Additionally or alternatively to adjusting the resonator 50 parameters (e.g., by adjusting the Q factor and/or the coupling coefficient) using the capacitors (e.g., the first capacitor 56 and the second capacitor 58), the resistors (e.g., the first resistor 57 and/or the second resistor 59), and/or the shunt and series resistors (e.g., the shunt resistors 60, 62 and the series resistors 64, 66), the resonator 50 may be implemented with a ripple reduction loop that includes a third inductor with an additional resistor. Specifically, the ripple reduction loop may be used to adjust the coupling coefficient as opposed to the Q factor, which may be finite.

Figure 11A:
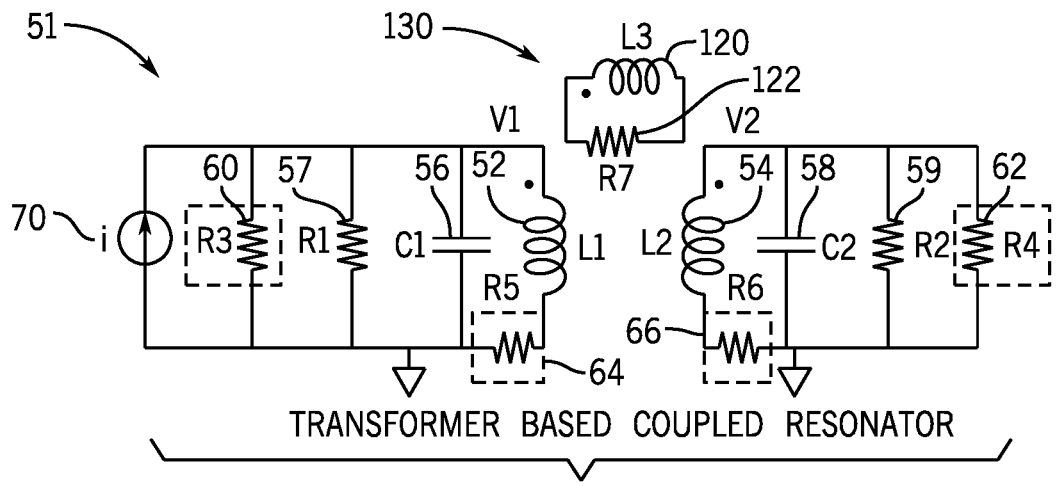
FIG. 11A is a circuit diagram showing a resonator with a conductive loop that reduces an in-band ripple of the frequency response of the resonator of FIG. 7, according to embodiments of the present disclosure.

To illustrate, FIG. 11A depicts a resonator 51, which may include the same components as the resonator 50 of FIG. 9A, and a ripple reduction loop 130 (e.g., De-Q loop), according to embodiments of the present disclosure. The ripple reduction loop 130 includes a third inductor 120 ($L_3$) and an additional resistor 122 ($R_7$). The resonator 51 may also include the first inductor 52, the second inductor 54, the first capacitor 56, the second capacitor 58, the first resistor 57, and the second resistor 59. In some embodiments, the resonator 51 may include the first shunt resistor 60, the second shunt resistor 62, the first series resistor 64, and/or the second series resistor 66. In general, the resonator 51 may implement a ripple-reduction technique for wideband filters for a frequency range of 24-48 GHz.

Figure 11B:
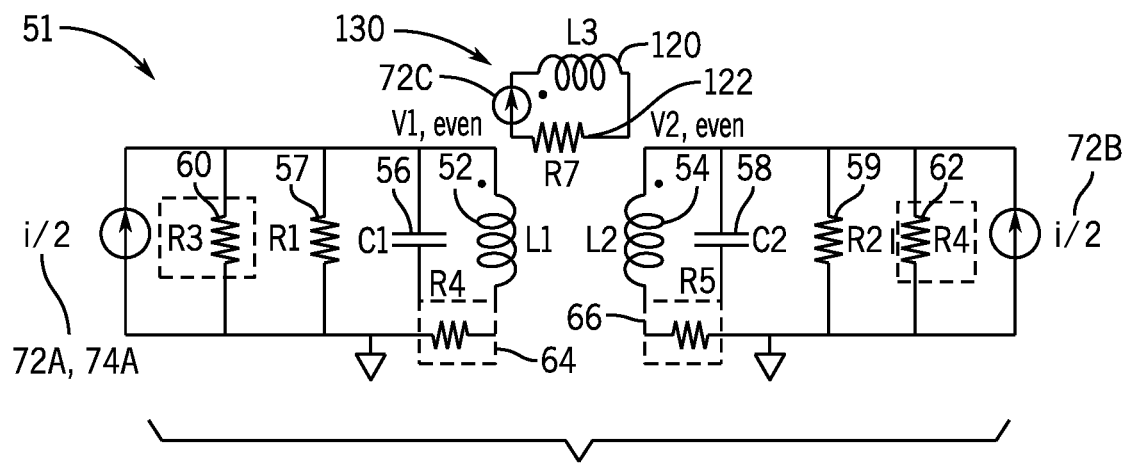
FIG. 11B is a circuit diagram showing the resonator of FIG. 11A with even mode current, according to embodiments of the present disclosure.
Figure 11C:
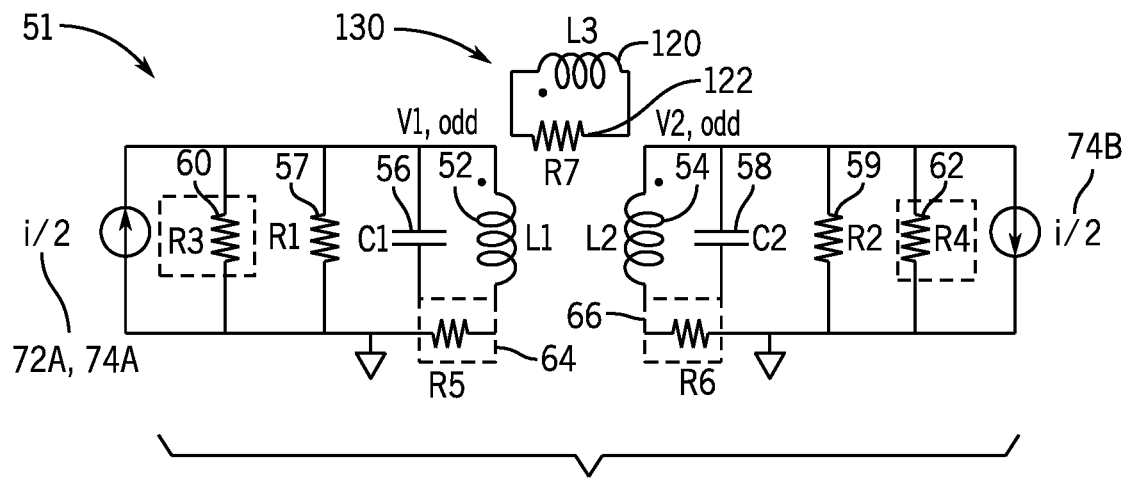
FIG. 11C is a circuit diagram showing the resonator of FIG. 11A with odd mode current, according to embodiments of the present disclosure.

These components may provide the same or similar respective functionalities as described with respect to FIGS. 9A-9C. FIGS. 11B and 11C depict the resonator 51, which includes the same respective components as the resonator 50 of FIG. 9B and FIG. 9C, but with the ripple reduction loop 130 having the third inductor 120 and the additional resistor 122, according to embodiments of the present disclosure. As shown in FIG. 11B, a third even mode current 72C flowing through the third inductor 120 may follow the same direction as the coils in the first inductor 52 and the second inductor 54. In particular, the first even mode current 72A through the first inductor 52 may induce the second even mode current 72B in the second inductor 54 and the third even mode current 72C in the third inductor 120. The second inductor 54 may also induce the third even mode current 72C in the third inductor 120. Although not shown, in some embodiments, a portion (e.g., a third or approximately a third) of total current 70 through the first inductor 52 may transfer into each of the second inductor 54 and the third inductor 120.

On the other hand in FIG. 11C, since the first odd mode current 74A flowing through the first inductor 52 and the second odd mode current 74B flowing through the second inductor 54 flow in opposite directions and have equal magnitudes, the currents may cancel each other out, such that there is no transfer of current into the third inductor 120. As a result, the first odd mode current 74A and the second odd mode current 74B do not flow through the additional resistor 122.

The ripple reduction loop 130 may facilitate matching the gain peaks of the two frequency poles 110, 112. Specifically, the ripple reduction loop 130 reduces the gain of the first frequency pole 110 (e.g., the low frequency pole) while either not affecting or minimally affecting the gain of the second frequency pole 112 (e.g., the high frequency pole), which is associated with the leakage inductance Q factor. The ripple reduction loop 130 may also not affect or minimally affect the gain of the output signal at the frequencies between the frequency poles 110, 112. That is, the ripple reduction loop 130 may substantially maintain the gain of the output signal (e.g., maintain gain of the output signal at approximately every frequency besides the low frequency pole) while decreasing the in-band ripple caused by the frequency poles 110,112. In some embodiments, the ripple reduction loop 130 may minimally reduce the gain in between the first frequency pole 110 and the second frequency pole 112. However, the gain in between the first frequency pole 110 and the second frequency pole 112 may already be significantly lower than the poles 110, 112, and as such, the ripple reduction loop 130 may not reduce the gain as much as it does for the gain peaks of the poles 110, 112. Thus, the ripple reduction loop 130 may control and facilitate in matching (e.g., correlate to) the gain peak of the first frequency pole 110 to the gain peak of the second frequency pole 112, as opposed to other filter parameter adjusting methods that may compromise the gain of the peaks at both frequency poles 110, 112.

In some embodiment, the additional resistor 122 may be a fixed resistor (e.g., provide a single, fixed resistance). In other embodiments, the additional resistor 122 may be a programmable variable resistor that may provide a variable electrical resistance. In such embodiments, the additional resistor 122 may include a component (e.g., a controller having a processor, such as the processor 12) used to vary the amount of current that flows through the resonator 51. Thus, the ripple reduction loop 130 that includes the additional resistor 122 may dynamically adjust gain to provide a dynamic ripple reduction. The gain at the second frequency pole 112 may vary, for example, based on factors external to the resonator 50 (e.g., the input signal and/or environmental factors). In such instances, the ripple reduction loop 130 may adjust the additional resistor 122 to reduce gain at the first frequency pole 110 and in accordance with (e.g., to correlate with or approximately match) the second frequency pole 112. Furthermore, the additional resistor 122 may be programmed to a particular resistance to vary the gain and smooth out the frequency response when there are multiple poles (e.g., three or more cascaded poles) causing the in-band ripple. In such instances, the additional resistor 122 may be programmed with a different resistance value based on each of the poles and the difference in gain between the poles.

Figure 12:
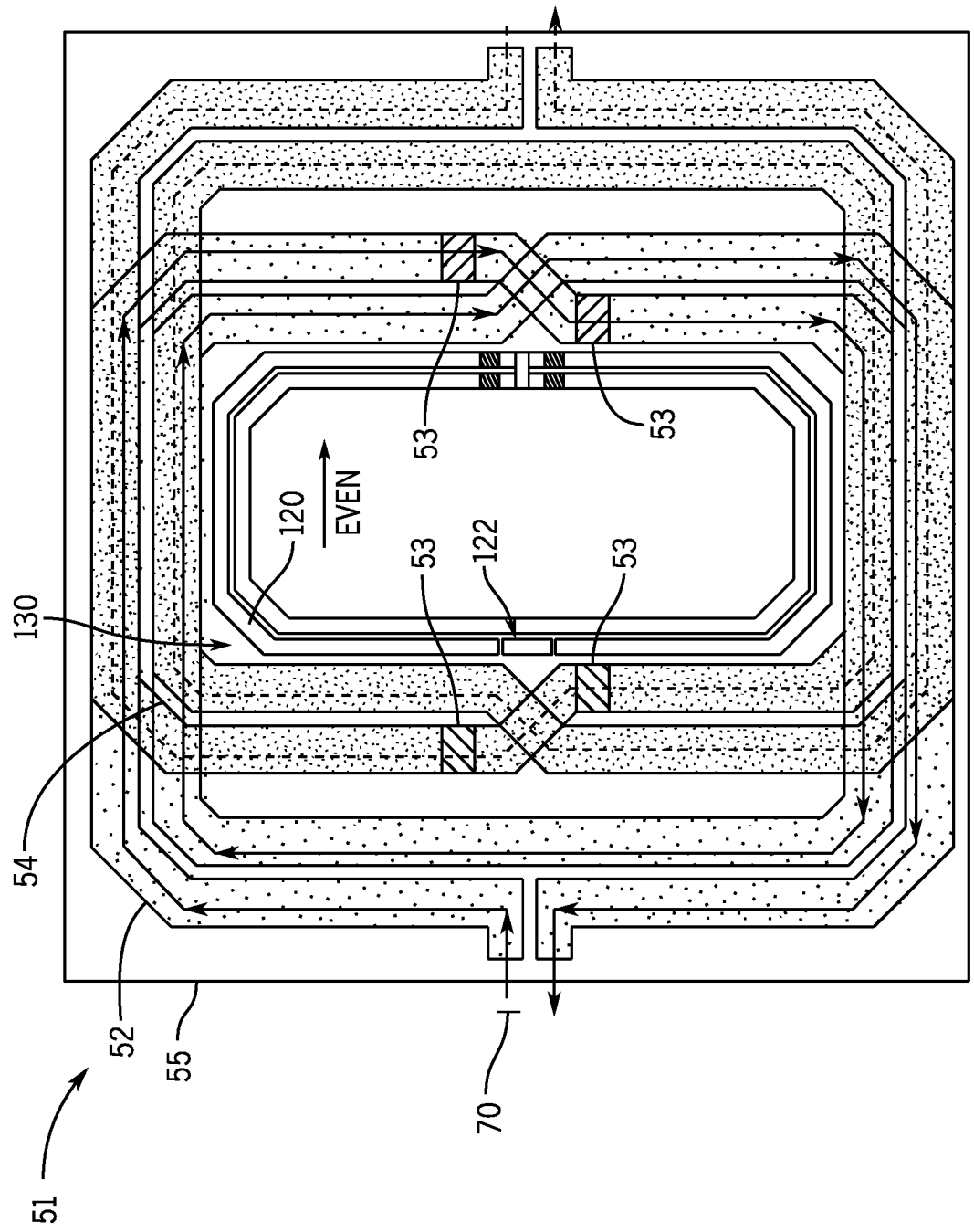
FIG. 12 is a schematic diagram of the resonator of FIG. 11A, according to embodiments of the present disclosure.

FIG. 12 depicts the resonator 51 on a silicon chip. Although the following discussion describes the resonator 51 implemented on the PCB, which represents a particular embodiment, the resonator 51 may instead be implemented on the silicon chip or an integrated circuit. As shown, the first inductor 52 (indicated by a light dot pattern), the second inductor 54 (indicated by a dark dot pattern), and the ripple reduction loop 130 (indicated without pattern), may be arranged in a stacked architecture on the PCB 55, according to embodiments of the present disclosure. The first inductor 52, the second inductor 54, and/or the ripple reduction loop 130 may be mounted on and/or etched (e.g., positioned) onto one or more layers of the PCB 55. Here, the ripple reduction loop 130 is positioned on a first (e.g., lower) layer of the PCB 55. The first inductor 52 is positioned on the second (e.g., higher) layer of the PCB 55, and the second inductor 54 is positioned on a third (e.g., higher than the second) layer of the PCB 55.

In some embodiments, the inductors 52, 54, 120, and/or a portion of the inductors 52, 52, 120 may be disposed on separate layers of the PCB 55. For example, a portion of coils of the third inductor 120 may be positioned on the first layer while another portion of coils of the third inductor 120 is positioned on the second layer or another layer. Moreover, a portion of coils of the first inductor 52 may be positioned on the second layer while another portion of coils of the first inductor 52 is positioned on the third layer or another layer. In such embodiments, these portions may be coupled using vias 53, such that current flowing through the first inductor 52 may flow between the two layers without disruption. Similarly, the second inductor 54 may also include a portion of its coils on the third layer while another portion of its coils is positioned on a fourth (e.g., higher than the third) layer or another layer. The second inductor 54 may also include the vias 53 to couple these portions together.

As shown, the ripple reduction loop 130 is a conductive loop (e.g., a metal loop) that includes the third inductor 120 and the additional resistor 122 in series. Although the descriptions describe the ripple reduction loop 130 as a conductive loop, which represents a particular embodiment, the ripple reduction loop 130 may additionally or alternatively include one or more metal coils in which portions of its coils are positioned on different layers in the stacked architecture, as previously discussed, of the resonator 51. The first inductor 52 and the second inductor 54 may be symmetrical, such that they are made of the same material, have the same thickness, have the same length, have the same dimensions, and/or have the same number of coils. In some embodiments, the ripple reduction loop 130 may be relatively thinner than the first inductor 52 and the second inductor 54. Specifically, the first inductor 52 may have a first thickness (e.g., a first cross-sectional width or diameter), the second inductor 54 may have a second thickness (e.g., a second cross-sectional width or diameter), and the ripple reduction loop 130 may have a third thickness (e.g., a third cross-sectional width or diameter). The third thickness may be less than the first thickness and less than the second thickness. By way of example, the first inductor 52 and the second inductor 54 may be 2-3 micrometers (μm) and the reduction loop may be 0.1 μm.

As previously mentioned, the first even mode current 72A flowing through the first inductor 52 may induce the second even mode current 72B to flow through the second inductor 54 in the same direction (e.g., both in a clockwise direction or both in a counterclockwise direction). This positive feedback of the even mode currents 72A, 72B in the same direction may induce the third even mode current 72C in the third inductor 120. In particular, the first inductor 52 may induce at least a portion of the third even mode current 72C in the third inductor 120, and the second inductor 54 may induce at least a portion of the third even mode current 72C in the third inductor 120. As will be discussed herein, the additional resistor 122 may adjust parameters of the resonator 51 to change the frequency response of the input signal through the resonator 51. For example, the additional resistor 122 may lower the gain peak of the first frequency pole 110 to correlate to or approximately correlate to the gain peak of the second frequency pole. As previously mentioned, the even mode current through the resonator 50 and/or the resonator 51 may correspond to a low frequency pole while an odd mode current may correspond to a relatively high frequency pole.

When the first inductor 52 receives the first odd mode current 74A, the first odd mode current 74A may transfer current, such as the second odd mode current 74B, to the second inductor 54. The second odd mode current 74B is induced in an equal magnitude and opposite direction relative to the first odd mode current 74A (e.g., a clockwise direction in the first inductor 52 and a counterclockwise direction in the second inductor 54). As previously mentioned, the opposing currents may prevent current from transferring to the third inductor 120 due to canceling each other out. Thus, current may not flow through the additional resistor 122. As such, adjusting filter parameters (e.g., the coupling coefficient) of the resonator 51 to reduce the in-band ripple via the additional resistor 122 may affect the even mode current that corresponds to the low frequency peak. As previously discussed, the additional resistor 122 may be a variable resistor or a fixed resistor. As a variable resistor, the additional resistor 122 may be programmed based on a desired ripple reduction effect. The additional resistor 122 may also be programmed to vary during operation, and thus, may be dynamically programmed based on operational conditions. Alternative or additionally, the additional resistor 122 may be set as the fixed resistor based on test simulations during device manufacturing. Specifically, the additional resistor 122 may be fixed to a set resistance for a type and/or model of devices that may generally function in a similar manner during operation.

Figure 13:
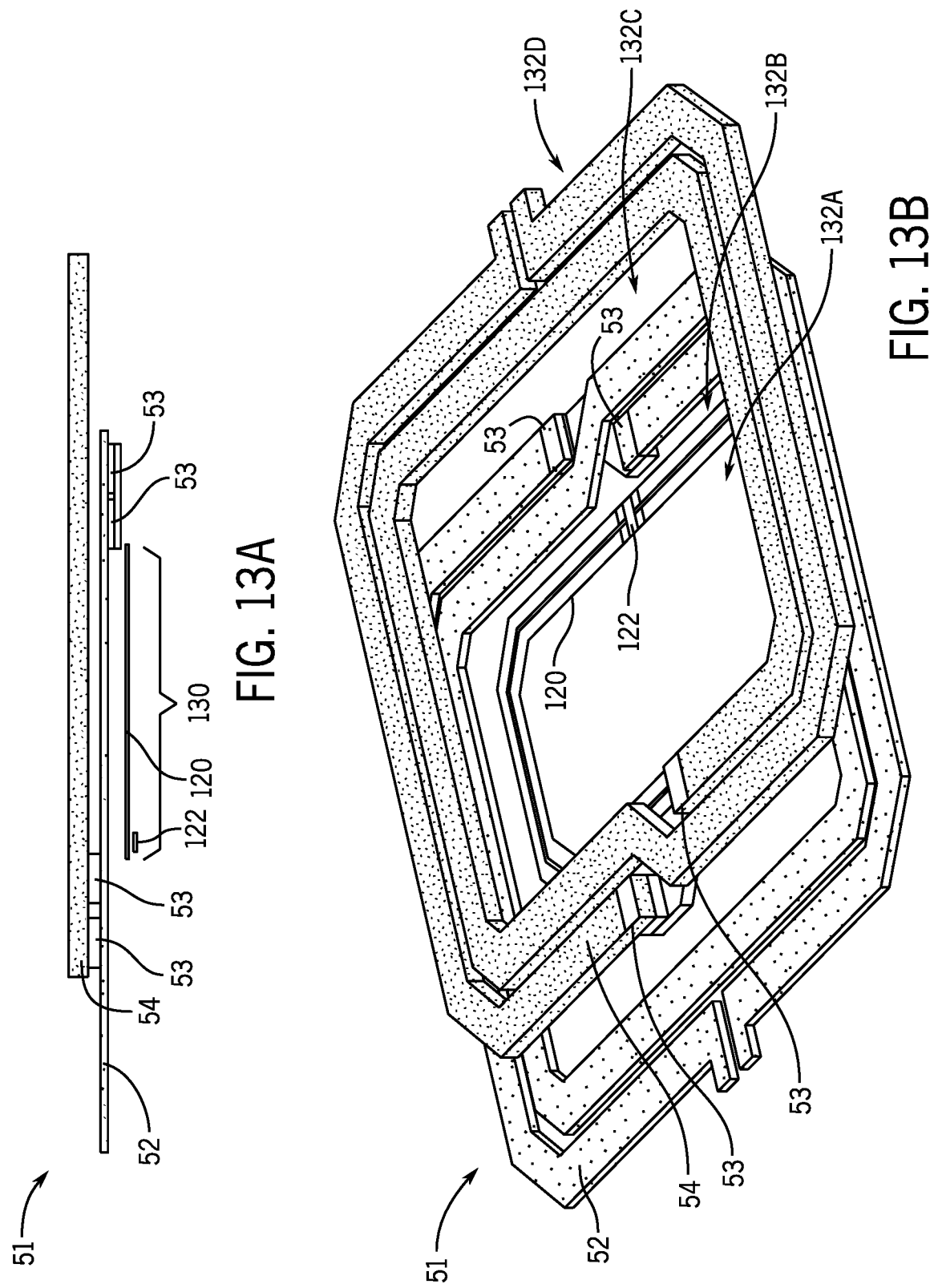
FIG. 13A is a schematic diagram of a cross-sectional view of the resonator of FIG. 11A, according to embodiments of the present disclosure.
FIG. 13B is a schematic diagram of a perspective view of the resonator of FIG. 11A, according to embodiments of the present disclosure.

For clarity, FIG. 13A is a schematic diagram showing a cross-sectional view of the resonator 51, and FIG. 13B is a schematic diagram showing a perspective view of the resonator 51, according to embodiments of the present disclosure. As illustrated, the first inductor 52 (indicated by a light dot pattern), the second inductor 54 (indicated by a dark dot pattern), and the ripple reduction loop 130 (indicated without pattern) that includes the third inductor 120 with the additional resistor 122, may be arranged in a stacked architecture on the PCB 55 (not shown). The first inductor 52, second inductor 54, and/or the ripple reduction loop 130 may be mounted on and/or etched (e.g., positioned) onto one or more layers of the PCB 55. The ripple reduction loop 130 is positioned on a first layer 132A (e.g., lower layer) of the PCB 55. The first inductor 52 is positioned on the second layer 132B (e.g., higher than the first layer) of the PCB 55, and the second inductor 54 is positioned on a third layer 132C (e.g., higher than the second layer) of the PCB 55. In some instances, and as previously discussed, a portion of the first inductor 52, the second inductor 54, and/or the third inductor 120 of the ripple reduction loop 130 may be on one or more layers. By way of example, a portion of the second inductor 54 may be disposed on the third layer 132C while another portion of the second inductor 54 is disposed on a fourth layer 132D (e.g., higher than the third layer 132C), in which these portions are connected by vias 53. The architecture and functionality of the resonator 51 may be implemented as previously described.

Figure 14:
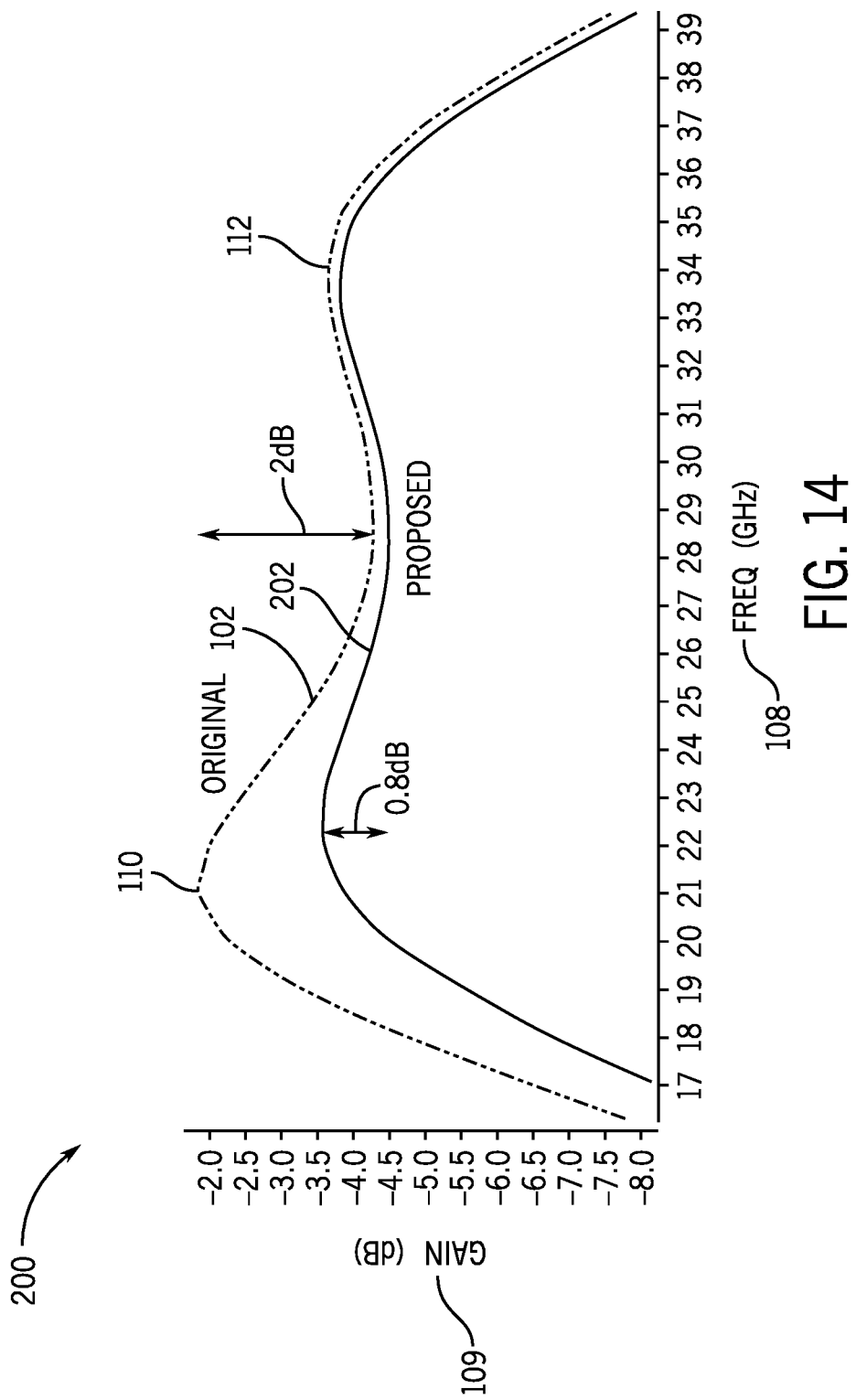
FIG. 14 is a graph illustrating frequency poles of a frequency response of an output signal through an operating region of the resonator of FIG. 11B, according to embodiments of the present disclosure.

FIG. 14 depicts a graph 200 illustrating a frequency response of the output signal through the operation region of the resonator 51, according to embodiments of the present disclosure. The first curve 102 illustrates the frequency response of the output signal of the resonator 50 without the ripple reduction loop 130. A second curve 202 illustrates the frequency response of the output signal of the resonator 51 implemented with the ripple reduction loop 130. As discussed with respect to FIG. 12, the ripple reduction loop 130 may smooth the gain of the frequency response over the operating region, which includes the gain peaks at the first frequency pole 110 (e.g., the low frequency pole) and the second frequency pole 112 (e.g., the high frequency pole), and the gain of the output signal at the frequencies between the low and high frequency poles. The ripple reduction loop 130 may smooth the gain of the frequency response over the operating region, for example, by correlating the gain peak at the low frequency pole to the high frequency pole using the additional resistor 122.

As shown, the first curve 102 shows a sharp contrast between the gain peaks of the first frequency pole 110 and the second frequency pole 112. The contrast between the peaks results in a 2 dB in-band ripple (e.g., the dip between the peaks). However, the contrast between the peaks decreases in the second curve 202 because of the ripple reduction loop 130 of the resonator 51. Specifically, the ripple reduction loop smooths out the frequency response over the operating region of the resonator 51 by matching the gain peak of the first frequency pole 110 to the gain peak of the second frequency pole 112, so that the contrast results in a 0.8 dB in-band ripple. As such, the systems and methods described herein of the resonator 51 with the ripple reduction loop 130 may facilitate smoothing the frequency response of the output signal through to the resonator 51 while minimizing gain loss.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. Radio frequency filtering circuitry comprising:
   a first inductor coupled to a current source and disposed on a first layer of a printed circuit board;
   a second inductor disposed on a second layer of the printed circuit board, the second layer disposed under the first layer, the first inductor being laterally offset from the second inductor to form an overlapping region, the first inductor being eccentric with the second inductor; and
   a conductive loop disposed on a third layer of the printed circuit board and in the overlapping region formed by the first inductor and the second inductor.

2. The radio frequency filtering circuitry of claim 1, wherein the second inductor is configured to inductively couple to the first inductor based on the current source supplying a first current to the first inductor, the first current inducing a second current in the second inductor.

3. The radio frequency filtering circuitry of claim 2, wherein a direction of even mode current flow of the second current corresponding to a direction of even mode current flow of the first current induces a third current in the conductive loop.

4. The radio frequency filtering circuitry of claim 2, wherein a direction of odd mode current flow of the second current opposing a direction of odd mode current flow of the first current prevents transfer of current to the conductive loop.

5. The radio frequency filtering circuitry of claim 2, wherein the first current, the second current, or both, induce a third current in the conductive loop.

6. The radio frequency filtering circuitry of claim 5, wherein the third current in the conductive loop reduces an in-band ripple between a first gain peak of an output signal of the radio frequency filtering circuitry and a second gain peak of the output signal.

7. The radio frequency filtering circuitry of claim 6, wherein the third current of the conductive loop reduces the in-band ripple between the first gain peak and the second gain peak by reducing the first gain peak to correspond to the second gain peak.

8. The radio frequency filtering circuitry of claim 7, wherein the first gain peak corresponds to a first frequency response of the output signal and the second gain peak corresponds to a second frequency response of the output signal.

9. The radio frequency filtering circuitry of claim 8, wherein the second frequency response corresponds to a higher frequency band than the first frequency response.

10. The radio frequency filtering circuitry of claim 6, wherein the third current reduces the in-band ripple to less than or equal 1 decibels.

11. The radio frequency filtering circuitry of claim 1, wherein a physical relationship between the first inductor, the second inductor, and the conductive loop enables reducing an in-band ripple between a first gain peak and a second gain peak of an output signal.

12. Processing circuitry comprising:
   a first inductor;
   a second inductor, the first inductor arranged to form a resonant circuit with the second inductor and being laterally offset from the second inductor, the first inductor comprising a first set of parallel edges and the second inductor comprising a second set of parallel edges, the first set of parallel edges being aligned with the second set of parallel edges; and
   a third inductor disposed relative to the first inductor and the second inductor to add or remove current from an output signal of the processing circuitry.

13. The processing circuitry of claim 12, wherein the third inductor is configured to add or remove the current from the output signal to correlate a first gain peak of the output signal to a second gain peak of the output signal.

14. The processing circuitry of claim 12, wherein, in response to receiving a first current, the first inductor induces a second current in the second inductor based at least in part on a magnetic flux caused by the first current, the second inductor inducing a third current in the third inductor based at least in part on a magnetic flux caused by the second current.

15. The processing circuitry of claim 14, wherein the third inductor is arranged to add or remove the current from the output signal to reduce an in-band ripple between a first gain peak and a second gain peak of the output signal.

16. The processing circuitry of claim 15, wherein the third inductor comprises a variable resistor configured to dynamically adjust a gain of the first gain peak, the second gain peak, or both, to reduce the in-band ripple between the first gain peak and the second gain peak.

17. The processing circuitry of claim 16, wherein reducing the in-band ripple results in approximately a 0.8 decibel in-band ripple.

18. An electronic device comprising:
   a display;
   one or more antennas;
   a transmitter configured to transmit an output signal of a radio frequency filtering circuitry of the electronic device via the one or more antennas;
   at least one processor configured to cause the transmitter to transmit the output signal via the one or more antennas;
   a current source configured to generate a first current; and
   the radio frequency filtering circuitry configured to provide the output signal, the radio frequency filtering circuitry comprising:
      a first coil disposed on a first layer of a printed circuit board and coupled to the current source, the first coil configured to receive the first current from the current source;
      a second coil disposed on a second layer of the printed circuit board, the first coil overlapping and being off center with respect to the second coil, the second coil configured to provide a second current induced by the first current traveling through the first coil; and
      a conductive loop configured to provide a third current induced by the first current traveling through the first coil and the second current traveling through the second coil, the output signal of the radio frequency filtering circuitry being based on the first current, the second current, and the third current.

19. The electronic device of claim 18, comprising a resistor coupled to the conductive loop and configured to adjust the third current to reduce an in-band ripple between a first gain peak of the output signal of the radio frequency filtering circuitry of the electronic device and a second gain peak of the output signal.

20. The electronic device of claim 19, wherein the resistor comprises a programmable resistor or a fixed resistor.

\* \* \* \* \*